(12) United States Patent
Tamai et al.

(10) Patent No.: US 6,992,920 B2
(45) Date of Patent: Jan. 31, 2006

(54) NONVOLATILE SEMICONDUCTOR MEMORY DEVICE, AND PROGRAMMING METHOD AND ERASING METHOD THEREOF

(75) Inventors: Yukio Tamai, Tenri (JP); Kohji Inoue, Ikoma (JP); Teruaki Morita, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 8 days.

(21) Appl. No.: 10/872,100

(22) Filed: Jun. 17, 2004

(65) Prior Publication Data

US 2004/0257864 A1 Dec. 23, 2004

(30) Foreign Application Priority Data

Jun. 17, 2003 (JP) .............................. 2003-171489
Sep. 19, 2003 (JP) .............................. 2003-327026

(51) Int. Cl.
*G11C 11/00* (2006.01)

(52) U.S. Cl. ................. 365/158; 365/100; 365/189.01; 365/185.29

(58) Field of Classification Search ................. 365/158
See application file for complete search history.

(56) References Cited

U.S. PATENT DOCUMENTS

| | | |
|---|---|---|
| 5,544,116 A | 8/1996 | Chao et al. |
| 5,550,770 A | 8/1996 | Kuroda |
| 6,204,139 B1 | 3/2001 | Liu et al. |
| 6,366,497 B1 | 4/2002 | Guliani et al. |

(Continued)

OTHER PUBLICATIONS

European Search Report mailed on Dec. 14, 2004 for EP patent application No. 04 25 3628, 6 pages.
Partial European Search Report mailed on Oct. 18, 2004 for EP patent application No. 04253628.4, 3 pages.

(Continued)

*Primary Examiner*—Connie C. Yoha
(74) *Attorney, Agent, or Firm*—Morrison & Foerster LLP

(57) ABSTRACT

One end of each variable resistive element, which forms a memory array, in the same row is connected to the same word line and the other end of each variable resistive element in the same column is connected to the same bit line. A first word line voltage is selected and applied to the selected word line, a second word line voltage is selected and applied to the unselected word lines, a first bit line voltage is selected and applied to the selected bit line, and a second bit line voltage is selected and applied to the unselected bit lines. The voltage difference between the first word line voltage and the first bit line voltage is set at a value that is no less than the first voltage difference that changes the resistance value of a variable resistive element, and the voltage difference between the first word line voltage and the second bit line voltage, the voltage difference between the second word line voltage and the first bit line voltage and the voltage difference between the second word line voltage and the second bit line voltage are respectively set at a value that is no greater than the second voltage difference that does not change the resistance value of a variable resistive element.

37 Claims, 23 Drawing Sheets

U.S. PATENT DOCUMENTS

| | | |
|---|---|---|
| 6,426,907 B1 | 7/2002 | Hoenigschmid |
| 6,804,138 B2 * | 10/2004 | Thompson et al. ......... 365/145 |
| 6,888,745 B2 * | 5/2005 | Ehiro et al. ................. 365/158 |
| 2002/0024835 A1 | 2/2002 | Thompson et al. |
| 2002/0060923 A1 | 5/2002 | Thompson et al. |
| 2003/0001178 A1 | 1/2003 | Hsu et al. |
| 2003/0081489 A1 | 5/2003 | Scheuerlein et al. |
| 2004/0213032 A1 * | 10/2004 | Maruyama .................. 365/145 |

OTHER PUBLICATIONS

Zhuang, W. W. et al. (2002). "Novell Colossal Magnetoresistive Thin Film Nonvolatile Resistance Random Access Memory (RRAM)," IEDM, Paper No. 7.5 *IEEE*, 4 pages.

* cited by examiner

| AB₁ | AB₂ | AB₃ | BLB₁ | BLB₂ | BLB₃ | BLB₄ | BLB₅ | BLB₆ | BLB₇ | BLB₈ |
|---|---|---|---|---|---|---|---|---|---|---|
| 0 | 0 | 0 | 1 | 0 | 0 | 0 | 0 | 0 | 0 | 0 |
| 1 | 0 | 0 | 0 | 1 | 0 | 0 | 0 | 0 | 0 | 0 |
| 0 | 1 | 0 | 0 | 0 | 1 | 0 | 0 | 0 | 0 | 0 |
| 1 | 1 | 0 | 0 | 0 | 0 | 1 | 0 | 0 | 0 | 0 |
| 0 | 0 | 1 | 0 | 0 | 0 | 0 | 1 | 0 | 0 | 0 |
| 1 | 0 | 1 | 0 | 0 | 0 | 0 | 0 | 1 | 0 | 0 |
| 0 | 1 | 1 | 0 | 0 | 0 | 0 | 0 | 0 | 1 | 0 |
| 1 | 1 | 1 | 0 | 0 | 0 | 0 | 0 | 0 | 0 | 1 |

NONVOLATILE SEMICONDUCTOR MEMORY DEVICE, AND PROGRAMMING METHOD AND ERASING METHOD THEREOF

BACKGROUND OF THE INVENTION

1. Field of the Invention

The present invention relates to a nonvolatile semiconductor memory device having a variable resistive element, which stores data due to a change in the electrical resistance through the application of voltage, on a semiconductor substrate.

2. Description of the Related Art

A technique of changing the resistance value of a material having a perovskite structure, at room temperature in a reversible manner by applying a voltage pulse to the material, which is known as a colossal magnetoresistance (CMR), is disclosed in U.S. Pat. No. 6,204,139, wherein the resistance value can be changed by a magnitude of ten times or more in a reversible manner through the application of a voltage pulse. FIG. 1 shows an example of the programming characteristics of this variable resistive element. As shown in FIG. 1, the resistance value of the variable resistive element changes depending on the magnitude of the program voltage. The resistance value can be changed by applying a voltage no less than a predetermined threshold voltage (Vth). Here, the term "threshold value" indicates the lower limit of the voltage that allows for a change in the resistance. A patent has been applied for by the applicant of the present case (JP-A 2002-185234) concerning a nonvolatile semiconductor memory device utilizing this property, and part of this content is disclosed in "Novel Colossal Magnetoresistive Thin Film Nonvolatile Resistance Random Access Memory (RRAM)", by Zhuang, H. H. et al., IEDM, article number 7.5, December, 2002.

According to this conventional technique, a memory cell is formed of a cell selecting element and a variable resistive element. FIG. 2 shows a memory cell according to the conventional technique wherein a transistor is used as the cell selecting element.

Programming and erasing operations in a memory cell shown in FIG. 2 will be briefly described below. In the case where programming is carried out in a variable resistive element R12, program voltage is applied to a bit line B2, a bit line B1 and a source line S1 are connected to the ground and a predetermined voltage is applied to a word line W1 for approximately 100 ns and thereby, a transistor T12, which is a cell selecting element, is turned on while a program voltage is applied to the variable resistive element R12, so as to convert the variable resistive element R12 to the program condition. At the time of erasing, an erase voltage is applied to the source line S1 and the bit line B1, the bit line B2 is connected to the ground and a predetermined voltage is applied to the word line W1 for approximately 100 ns and thereby, the transistor T12 is turned on while an erase voltage is applied to the variable resistive element R12, so as to convert the variable resistive element R12 to the erase condition. At this time, the polarities of the voltage applied to the variable resistive element R12 are opposite to those at the time of programming.

As shown in FIG. 2, however, in the case where a memory cell is formed of a cell selecting element made up of a transistor and a variable resistive element, only a slight problem occurs regarding 'disturbance' (error programming, error erasing and the like) of the unselected memory cells, which are not to be programmed or erased, since a cell selecting element made up of a transistor is provided. However, a memory cell is provided with a cell selecting element, increasing the area of the memory cell, which causes an increase in the chip size as a result of the integration of memory cells, and which is a factor hindering an increase in the capacity of the memory.

SUMMARY OF THE INVENTION

The present invention is made in view of the above problems, and an object thereof is to provide a nonvolatile semiconductor memory device that can be easily integrated at a high level wherein the occurrence of disturbance is restricted.

In order to achieve the above object, a nonvolatile semiconductor memory device according to the present invention comprises: a memory array formed of a plurality of memory cells, each having a variable resistive element of which the resistance value is changed in a reversible manner by applying a voltage, aligned in the directions of rows and columns, respectively, in a manner where one end of each memory cell in the same row is connected to the same word line while the other end of each memory cell in the same column is connected to the same bit line; a word line voltage application circuit formed so that one type of word line voltage can be selected from among a plurality of types to be applied to each of the word lines; and a bit line voltage application circuit formed so that one type of bit line voltage can be selected from among a plurality of types to be applied to each of the bit lines, wherein the word line voltage application circuit selects a first word line voltage at the time of programming or erasing operation so that the first word line voltage is applied to the selected word line that is connected to a selected memory cell to be programmed or erased, and selects a second word line voltage so that the second word line voltage is applied to the unselected word lines other than the selected word line, the bit line voltage application circuit selects a first bit line voltage at the time of programming or erasing operation so that the first bit line voltage is applied to the selected bit line that is connected to a selected memory cell to be programmed or erased, and selects a second bit line voltage so that the second bit line voltage is applied to the unselected bit lines other than the selected bit line, and the first word line voltage, the second word line voltage, the first bit line voltage and the second bit line voltage have particular voltage values in accordance with the programming or erasing operation so that the voltage difference between the first word line voltage and the first bit line voltage is set at a value equal to or more than a first voltage difference which allows the resistance value of the variable resistive element to exceed a predetermined value as a result of a change in the case where the first voltage difference is applied across both ends of the variable resistive element and so that the voltage difference between the first word line voltage and the second bit line voltage, the voltage difference between the second word line voltage and the first bit line voltage and the voltage difference between the second word line voltage and the second bit line voltage are respectively set at values equal to or less than a second voltage difference which does not allow the resistance value of the variable resistive element to exceed a predetermined value as a result of a change in the case where the second voltage difference is applied across the both ends of the variable resistive element.

In this manner, a cell selecting element is not provided in a memory cell in accordance with the nonvolatile semiconductor memory device according to the present invention;

therefore, the area of a memory cell can be reduced making a high level integration easily possible, and at the same time, a voltage that does not allow a change in the resistance value of a variable resistive element is applied across both ends of all of the unselected memory cells; therefore, there is no risk concerning the occurrence of disturbance in the unselected memory cells.

Further, in the nonvolatile semiconductor memory device according to the present invention, the word line voltage application circuit selects the second word line voltage before the start of the programming or erasing operation of the memory array so that the second word line voltage is applied to all of the word lines of the memory array, and the bit line voltage application circuit selects the second bit line voltage before the start of the programming or erasing operation of the memory array so that the second bit line voltage is applied to all of the bit lines of the memory array.

In this manner, according to the nonvolatile semiconductor memory device in accordance with the present invention, only the selected word line and the selected bit line connected to the selected memory cell to be programmed or erased are shifted to the first word line voltage and the second bit line voltage, respectively, in the case where the operation is shifted to the programming or erasing operation; therefore, simplification of the control mechanism can be achieved, and reduction in the amount of consumed power at the time of shifting can be achieved.

DETAILED DESCRIPTION OF THE INVENTION

Embodiments of the nonvolatile semiconductor memory device according to the present invention (hereinafter, appropriately referred to as "the inventive device") and the programming and erasing methods thereof will be described below with reference to the drawings.

FIRST EMBODIMENT

Figure 1:
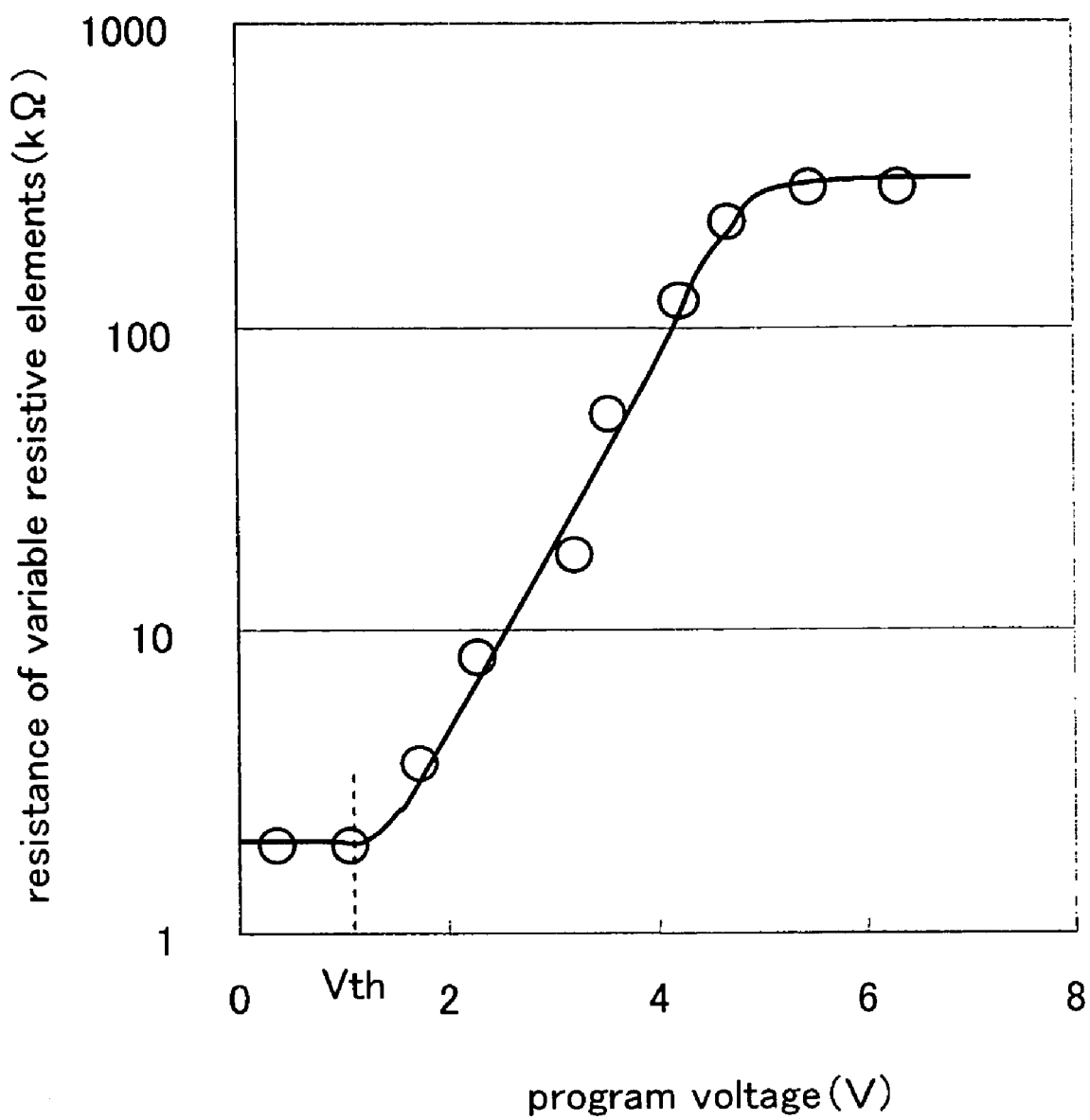
FIG. 1 is a graph showing programming characteristics of a variable resistive element.
Figure 2:
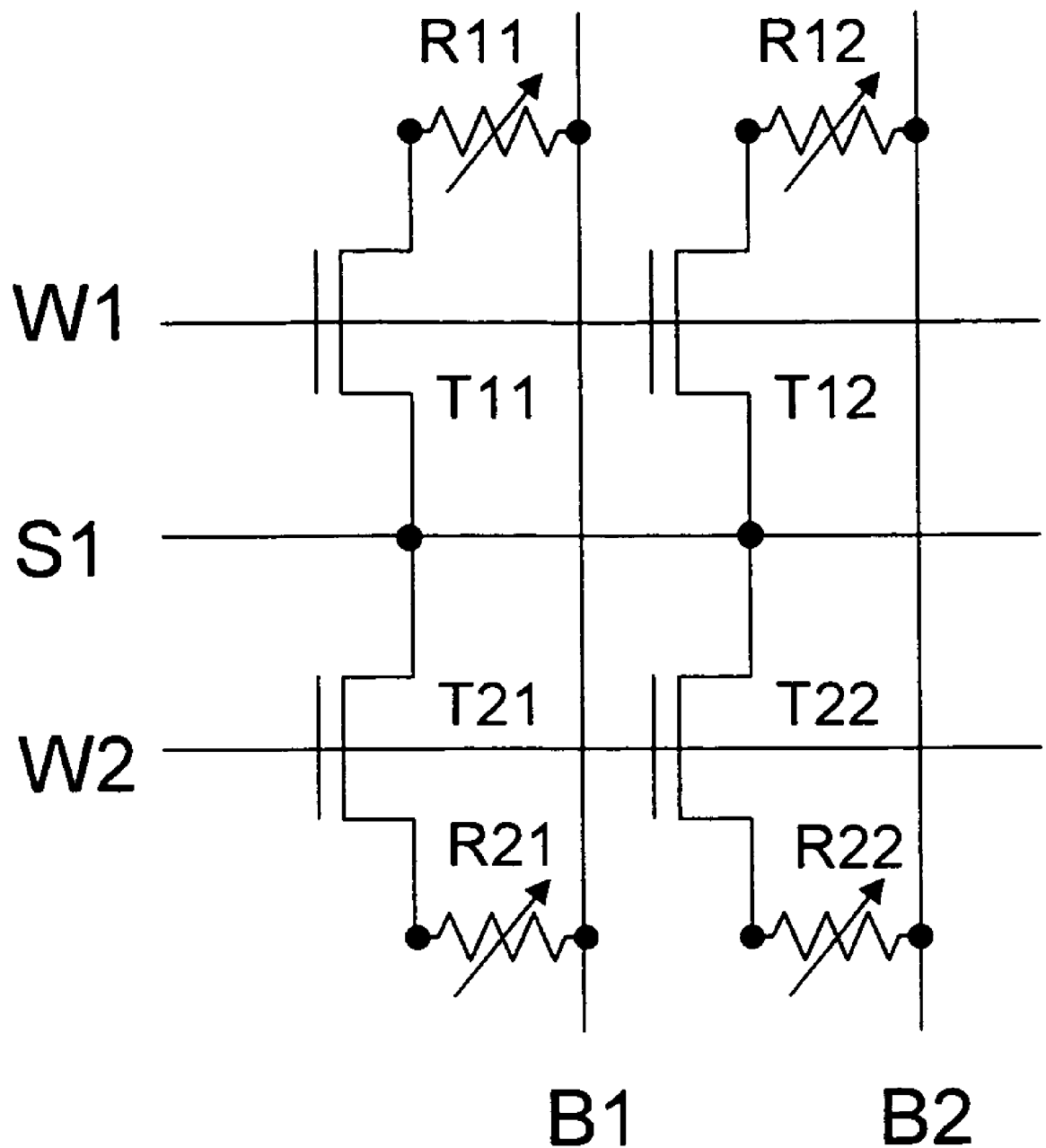
FIG. 2 is a circuit diagram showing the configuration of a memory array made up of memory cells having variable resistive elements where transistors are used as the conventional selecting elements.
Figure 3:
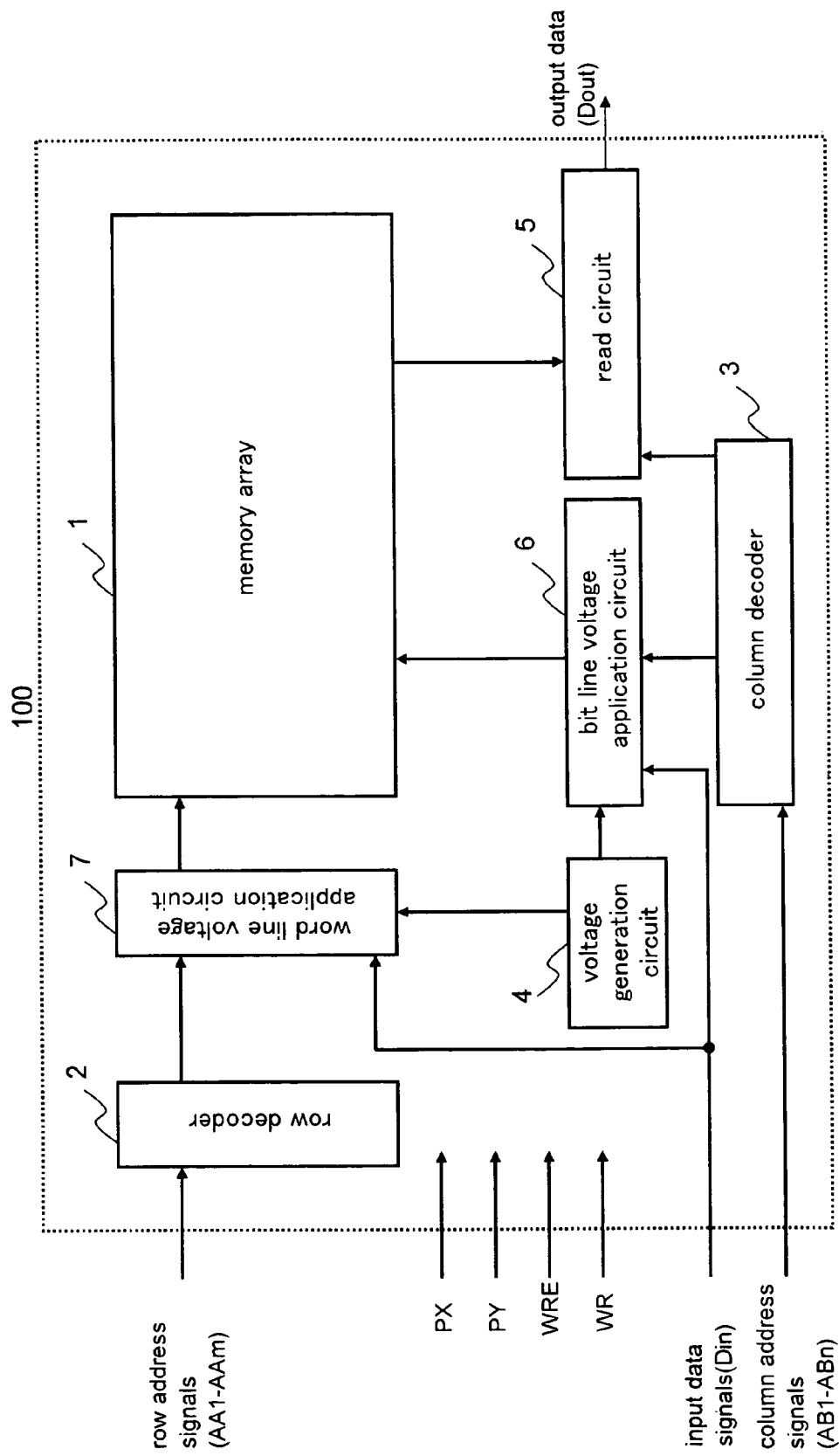
FIG. 3 is a function block configuration diagram showing a functional block configuration of one embodiment of the nonvolatile semiconductor memory device according to the present invention.

FIG. 3 is a block configuration diagram showing a functional configuration according to a first embodiment of the inventive device. As shown in FIG. 3, an inventive device 100 is formed of a memory array 1, a row decoder 2, a column decoder 3, a voltage generation circuit 4, a read circuit 5, a bit line voltage application circuit 6 and a word line voltage application circuit 7.

Figure 4:
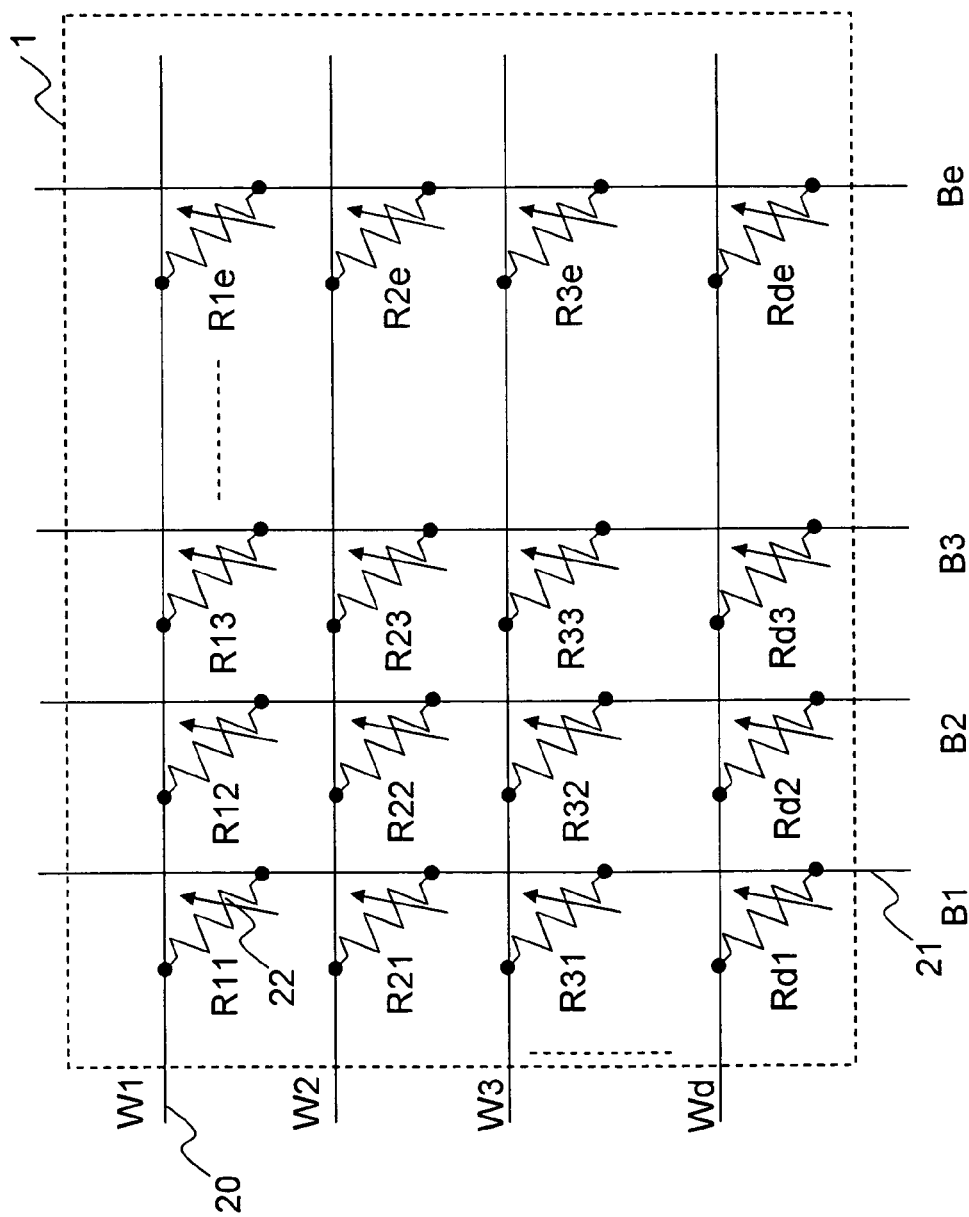
FIG. 4 is a circuit diagram showing the configuration of a memory array made up of memory cells in accordance with one embodiment of the nonvolatile semiconductor memory device according to the present invention.

FIG. 4 is a diagram showing the configuration of the memory array 1 of FIG. 3. The memory array 1 is provided with d word lines 20, e bit lines 21 and d×e memory cells. Each memory cell has a variable resistive element 22 at a portion where a bit line and a word line cross. One end of the variable resistive element 22 of each memory cell in the same row is connected to the same word line, and the other end of the variable resistive element 22 of each memory cell in the same column is connected to the same bit line. As shown in FIG. 4, no memory cells have a cell selecting element and therefore, the area of the memory cell can be greatly reduced in comparison with a memory cell having a cell selecting element.

The variable resistive element 22 is a nonvolatile memory element wherein the electrical resistance changes by applying a voltage so that the changed value of electrical resistance is maintained after the voltage application has been released and thereby, the storage of data becomes possible due to this change in resistance, and in the inventive device 100, the variable resistive element 22 stores 2-value data depending on whether the resistance value is in a high or low resistance condition.

In addition, the variable resistive element 22 is made of a material formed of an oxide having a perovskite-type crystal structure that contains manganese having a CMR (Colossal Magnetoresistance) effect, and materials, for example, fabricated by forming a manganese oxide film of either of the substances represented by $Pr_{1-x}Ca_xMnO_3$, $La_{1-x}Ca_xMnO_3$ (PCMO) or $La_{1-x-y}Ca_xPb_yMnO_3$ (here, x<1, y<1 and x+y<1), such as $Pr_{0.7}Ca_{0.3}MnO_3$, $La_{0.65}Ca_{0.35}MnO_3$ or $La_{0.65}Ca_{0.175}Pb_{0.175}MnO_3$ by means of an MOCVD method, a spin coating method, laser abrasion, a spattering method or the like are used.

Figure 5:
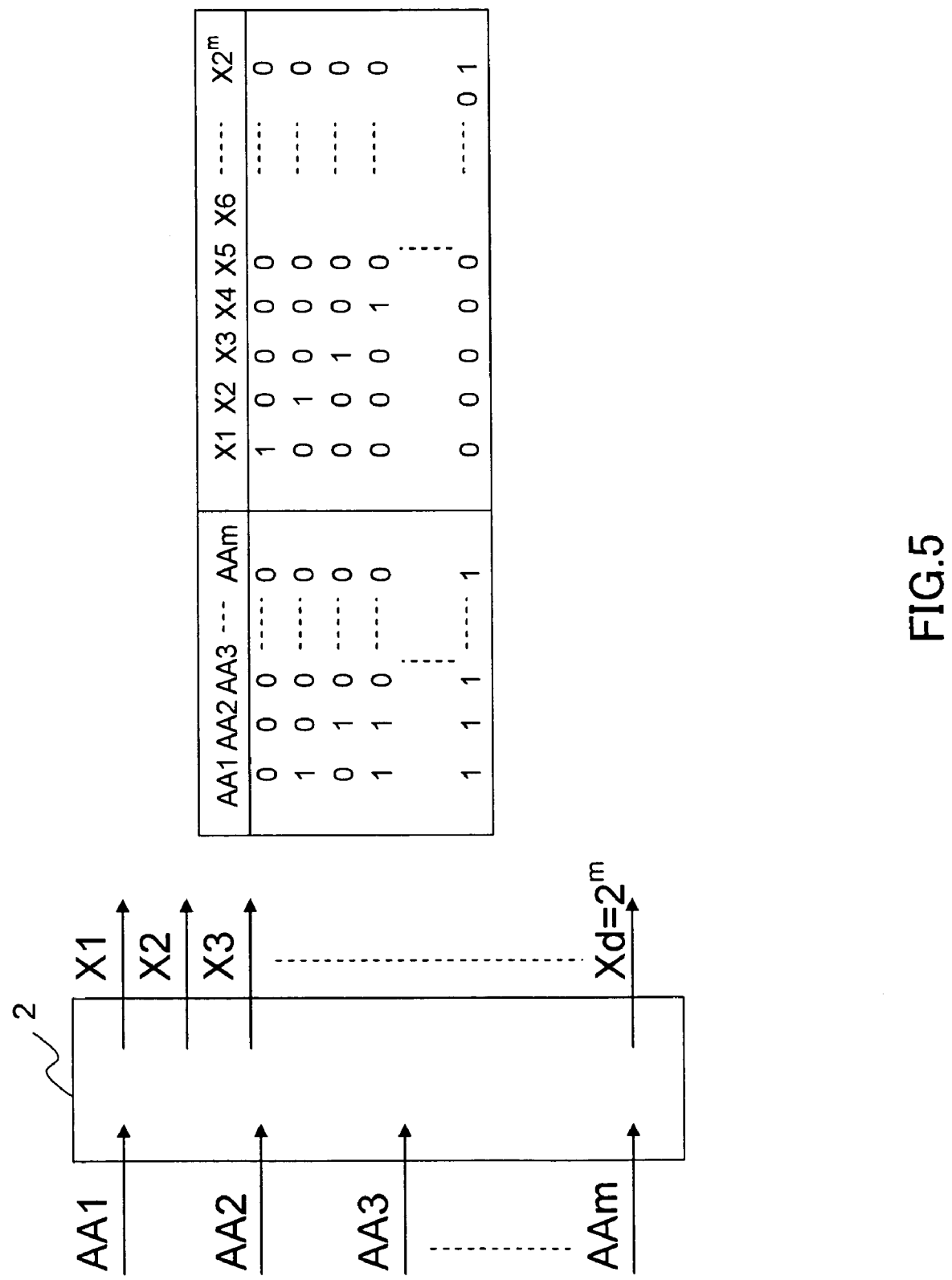
FIG. 5 is a diagram showing the configuration of a row decoder and the relationships between the row address signals and the outputs of the row decoder in accordance with one embodiment of the nonvolatile semiconductor memory device according to the present invention.

FIG. 5 is a diagram showing the configuration of the row decoder 2 of FIG. 3. The row decoder 2 has m address signals AA1 to AAm as inputs, and is provided with 2 to the power of m outputs X1 to $X2^m$ connected to the word lines. A signal of "1" is outputted from only one output responding to an address signal, as shown in FIG. 5, and the other outputs become "0". In the follow description, the logical levels of a digital signal are shown as "0" or "1" which are distinguished from the voltage value 1 V or 0 V of an analog signal.

Figure 6:
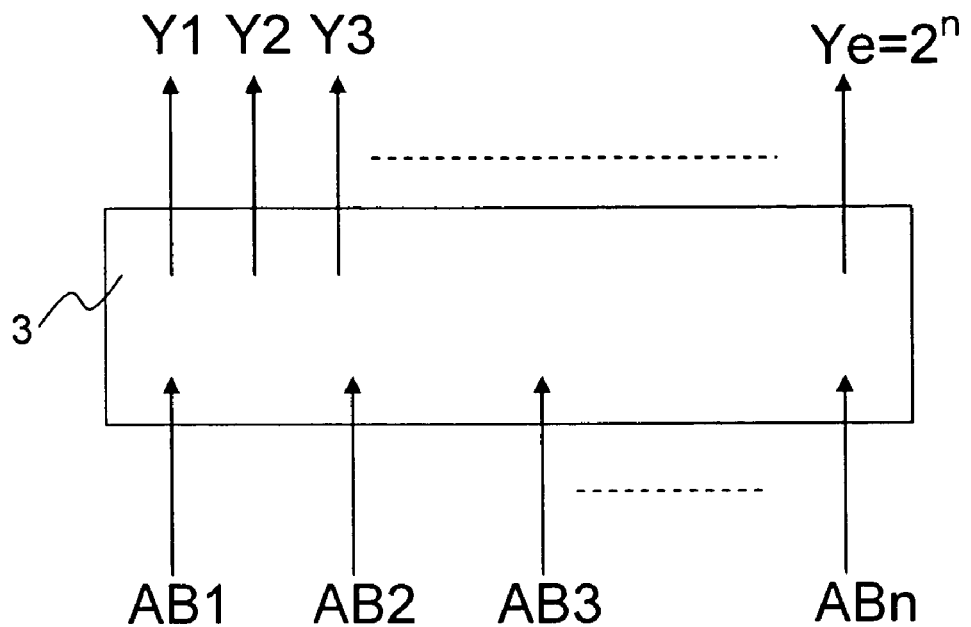
FIG. 6 is a diagram showing the configuration of a column decoder and the relationships between the column address signals and the outputs of the column decoder in accordance with one embodiment of the nonvolatile semiconductor memory device according to the present invention.

FIG. 6 is a diagram showing the configuration of the column decoder 3 of FIG. 3. The column decoder 3 has n address signals AB1 to ABn as inputs and is provided with 2 to the power of n outputs Y1 to $Y2^n$ connected to the bit lines. A signal of "1" is outputted from only one output responding to an address signal as shown in FIG. 6 while the other outputs become "0".

Figure 7:
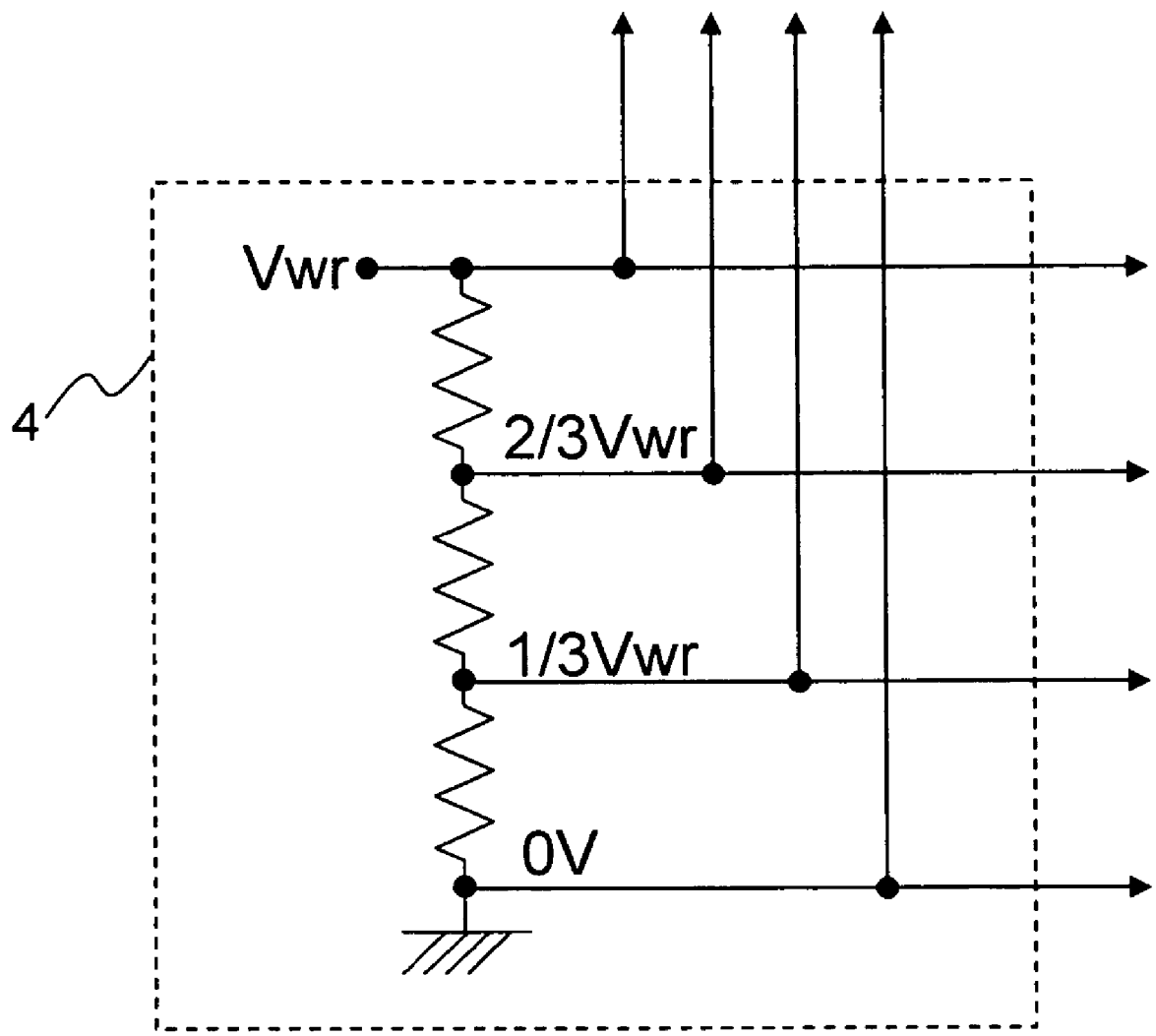
FIG. 7 is a circuit diagram showing one configuration example of a voltage generation circuit in accordance with one embodiment of the nonvolatile semiconductor memory device according to the present invention.

FIG. 7 is a diagram showing the configuration of the voltage generation circuit 4 of FIG. 3. Four reference voltages of which the voltage values are Vwr (V), ⅔Vwr (V), ⅓Vwr (V) and 0 (V) are outputted by means of a division circuit using resistances. They are referred to as the first, second, third and forth reference voltages in the order shown above. The second reference voltage ⅔Vwr and the third reference voltage ⅓Vwr respectively have the voltage values of two thirds of the first reference voltage Vwr and one third of the first reference voltage Vwr. These are, as described below, utilized as the first and second word line voltages of the word line voltage application circuit 7 and the first and second bit line voltages of the bit line voltage application circuit 6. Here, the voltage value of the first reference voltage Vwr is set at a value no less than the first voltage difference that allows a change in the resistance value to exceed a predetermined value in the case where the first voltage difference is applied across both ends of a variable resistive element, and the voltage value of the third reference voltage ⅓Vwr is set at a value no more than the second voltage difference that does not allow a change in the resistance value to exceed a predetermined value, in the case where the third voltage difference is applied across both ends of a variable resistive element.

Figure 8:
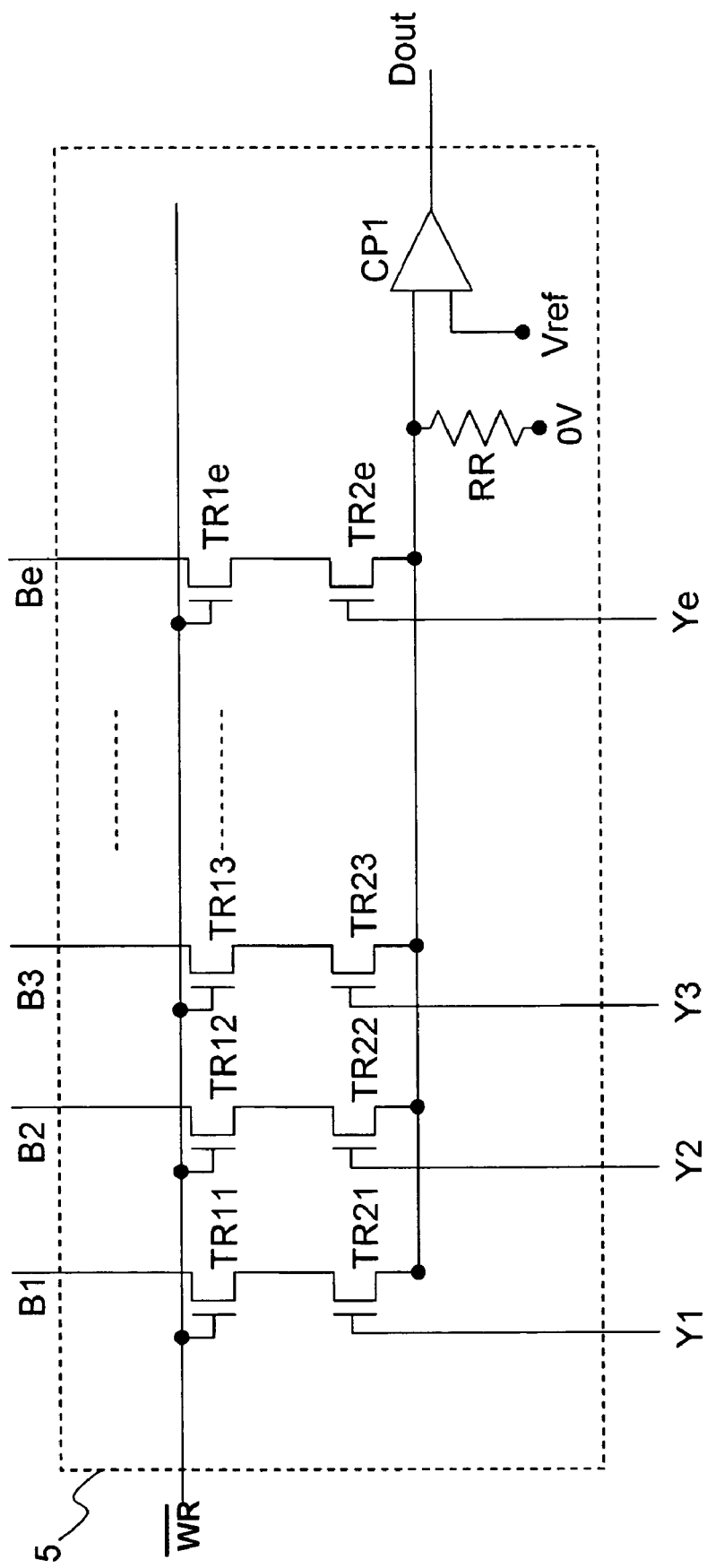
FIG. 8 is a circuit diagram showing one configuration example of a read circuit in accordance with one embodiment of the nonvolatile semiconductor memory device according to the present invention.

FIG. 8 is a diagram showing the configuration of the read circuit 5 of FIG. 3. A voltage that appears in one bit line is selected by transistors TR11 to TR1e and TR21 to TR2e and is inputted to a comparator CP1 via a read data line 30 so as to be compared with a reference voltage Vref and thereby, output data Dout is obtained.

Programming and reading operations are switched by a program/read switching signal WR. When the program/read switching signal WR is "0" the reading operation is carried out turning on the transistors TR11 to TR1e. In addition, one of the transistors TR21 to TR2e is turned on by outputs Y1 to Ye of the column decoder so that the bit line linked to the selected cell and a read data line 30 are connected and thereby, the read data line 30 is connected to the comparator CP1. Furthermore, a fixed resistor RR of which one end is fixed at the ground voltage (0 V), which is a fixed voltage, is connected to the read data line 30. The resistance value of this fixed resistor RR is set at RL which is the same resistance value as of the low resistance condition of the variable resistive element of a memory cell.

Figure 9:
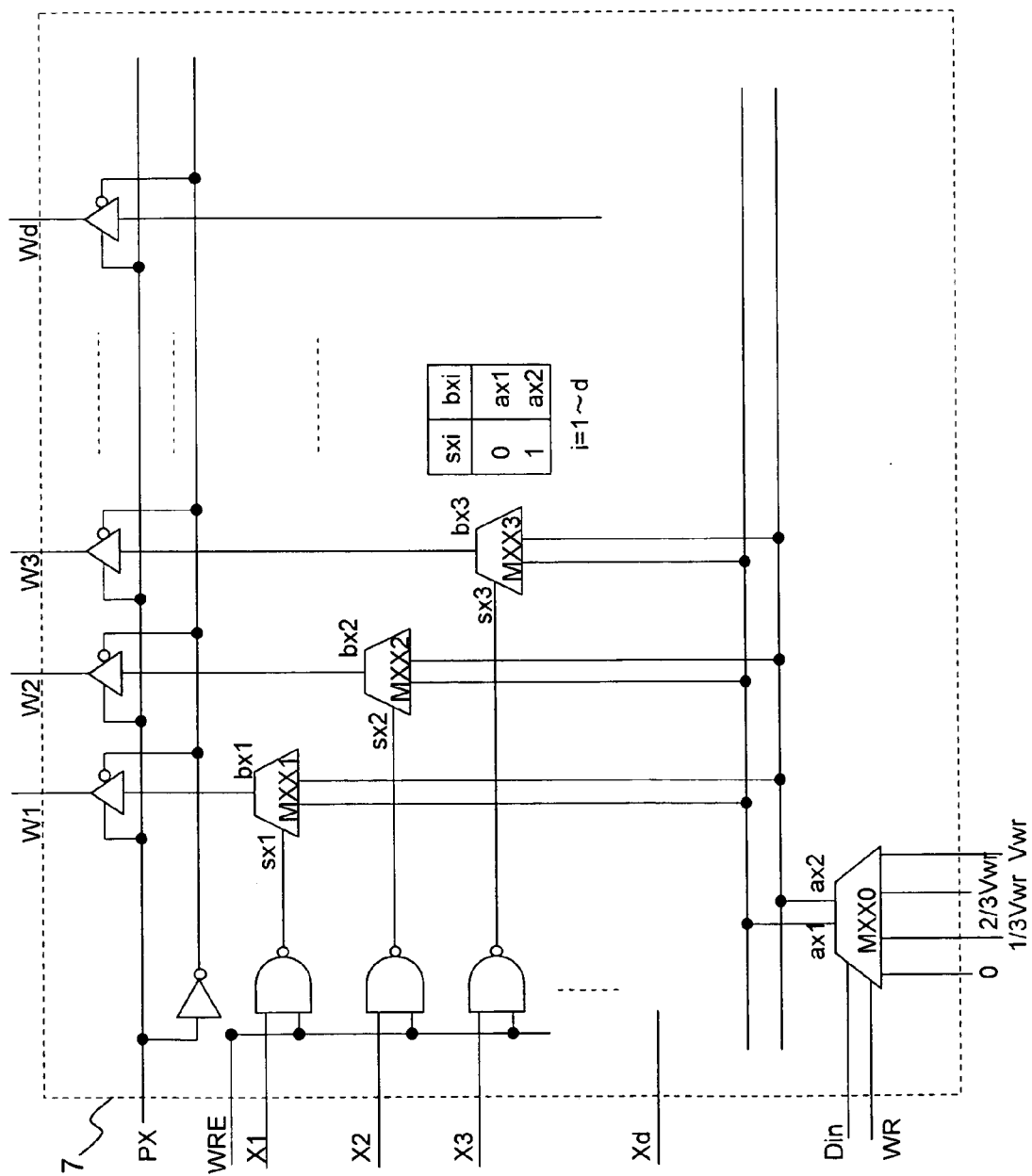
FIG. 9 is a logic circuit diagram showing one configuration example of a word line voltage application circuit in accordance with one embodiment of the nonvolatile semiconductor memory device according to the present invention.

FIG. 9 is a diagram showing the configuration of the word line voltage application circuit 7 of FIG. 3. The word line voltage application circuit is configured in a manner wherein either of first and second word line voltages ax1 and ax2 can be selected and applied to each of a plurality of word lines W1 to Wd, and the first and second word line voltages ax1 and ax2 are selected from among the four reference voltages Vwr (V), ⅔Vwr (V), ⅓Vwr (V) and 0 (V) generated by the voltage generation circuit 4 so that they are allocated as the first and second word line voltages in accordance with the times of programming, erasing and reading operations. The word line voltage application circuit 7 applies voltages at the times of both programming and erasing operations and reading operation wherein the operations are switched by the program/read switching signal WR.

When the program/read switching signal WR is "1", the operation is in the programming and erasing modes wherein reference voltages which are different depending on input data Din are selected by a multiplexer MXX0 as the first and second word line voltages ax1 and ax2 based on the corresponding relationships shown in Table 1. When the input data Din is "1", the programming operation is carried out and when the input data Din is "0", the erasing operation is carried out. The selection between the second word line voltage ax2 that becomes the precharge voltage or the first word line voltage ax1 that becomes the program and erase voltages, is carried out by multiplexers MXX1 to MXXd. When a program/erase control signal WRE is "1", the first word line voltage ax1 is applied to only one selected word line, to which the selected memory cell is connected, and the second word line voltage ax2 is applied to all of the unselected word lines other than the selected word line. When the program/erase control signal WRE is "0", the second word line voltage ax2 that is the precharge voltage is applied to all of the word lines.

When the program/read switching signal Wt is "0", the operation is in the read mode wherein the first word line voltage ax1 is selected by the multiplexer MXX0 as the read voltage. When the program/erase control signal WRE is "1", the read voltage is applied to only one selected word line to which the selected memory cell is connected, and the second word line voltage ax2 is applied to all of the unselected word lines other than the selected word line. The voltage applications to the word lines W1 to Wd are controlled by a row drive control signal PX in a manner where all of the word lines become of a high impedance condition when the row drive control signal PX is "0". Here, Table 1 shows the corresponding relationships between the first word line voltage ax1 selected by the multiplexer MXX0, the second word line voltage ax2 and the four reference voltages Vwr, $\frac{2}{3}$Vwr, $\frac{1}{3}$Vwr and 0 (V) at the time of each operation.

TABLE 1

| Operation mode | WR | Din | ax1 | ax2 |
| --- | --- | --- | --- | --- |
| Erase | 1 | 0 | 0 | $\frac{2}{3}$ Vwr |
| Program | 1 | 1 | $\frac{1}{3}$ Vwr | Vwr |
| Read | 0 | X | $\frac{1}{3}$ Vwr | 0 |

Figure 10:
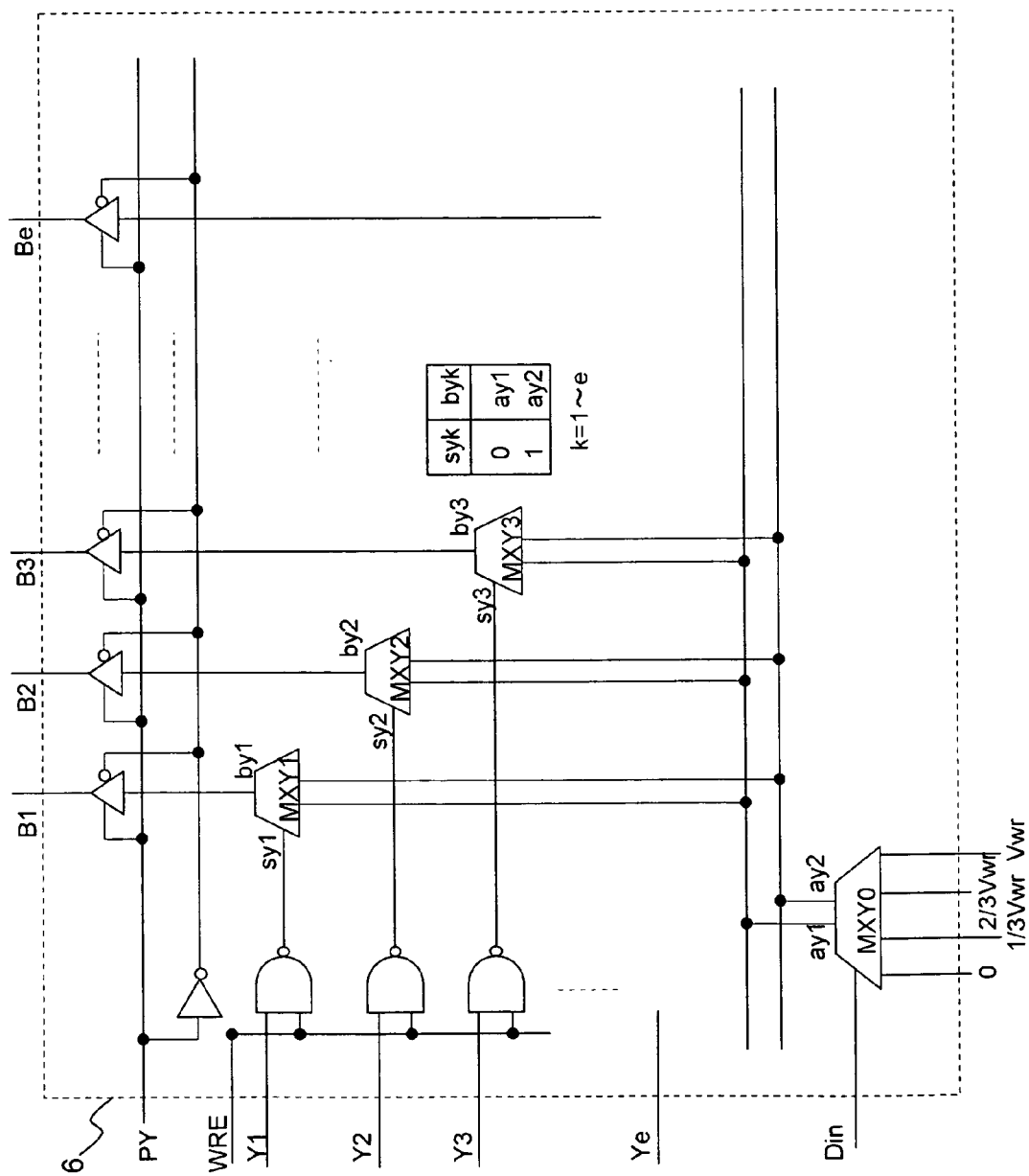
FIG. 10 is a logic circuit diagram showing one configuration example of a bit line voltage application circuit in accordance with one embodiment of the nonvolatile semiconductor memory device according to the present invention.

FIG. 10 is a diagram showing the configuration of the bit line voltage application circuit 6 of FIG. 3. The bit line voltage application circuit 6 is configured in a manner wherein either of first and second bit line voltages ay1 and ay2 can be selected and applied to each of a plurality of bit lines B1 to Be, and the first and second bit line voltages ay1 and ay2 are selected from among the four reference voltages Vwr (V), $\frac{2}{3}$Vwr (V), $\frac{1}{3}$Vwr (V) and 0 (V) generated by the voltage generation circuit 4 so that they are allocated as the first and second bit line voltages in accordance with the times of programming and erasing operations. The bit line voltage application circuit 6 has a configuration wherein voltage applications are only carried out at the time of programming and erasing operations.

A reference voltage that differs depending on the input data Din is selected by multiplexer MXY0 as the first or second bit line voltage ay1 or ay2 based on the corresponding relationships shown in Table 2. When the input data Din is "1" the programming operation is carried out and when the input data Din is "0" the erasing operation is carried out. The selection of either the second bit line voltage ay2 that becomes the precharge voltage or the first bit line voltage ay1 that becomes the program/erase voltage is carried out by multiplexers MXY1 to MXYe. When the program/erase control signal WRE is "1", the first bit line voltage ay1 is applied only to the selected bit line to which the selected memory cell is connected and the second bit line voltage ay2 is applied to all of the unselected bit lines other than the selected bit line. When the program/erase control signal WRE is "0", the second bit line voltage ay2, which is the precharge voltage, is applied to all of the bit lines. The voltage applications to the bit lines B1 to Be are controlled by a column drive control signal PY and when column drive control signal PY is "0", all of the bit lines are in a high impedance condition. At the time of reading, the column drive control signal PY becomes "0", and all of the bit lines are in a high impedance condition. Here, Table 2 shows the corresponding relationships between the first and second bit line voltages ay1 and ay2 selected by the multiplexer MXY0 at the time of the programming and erasing operations and the four references voltages Vwr, $\frac{2}{3}$Vwr, $\frac{1}{3}$Vwr and 0 (V).

TABLE 2

| Operation mode | Din | ay1 | ay2 |
| --- | --- | --- | --- |
| Erase | 0 | 0 | $\frac{2}{3}$ Vwr |
| Program | 1 | $\frac{1}{3}$ Vwr | Vwr |

The programming, erasing and reading operations will be described below based on the timing chart at the time of programming, erasing and reading shown in FIG. 11.

At the time of Din="1", the program/read switching signal WR is set at "1" so that the operation is in the program mode. At this stage, ax1=Vwr and ax2=$\frac{1}{3}$Vwr are selected as the outputs of the multiplexer MXX0 while ay1=0 (V) and ay2=$\frac{2}{3}$Vwr are selected as the outputs of the multiplexer MXY0. While the program/erase control signal WRE is "0", the second word voltage ax2, that is, $\frac{1}{3}$Vwr is selected as the outputs of the multiplexers MXX1 to MXXd and the second bit line voltage ay2, that is, $\frac{2}{3}$Vwr is selected as the outputs of the multiplexers MXY1 to MXYe. Next, when the row drive control signal PX is set at "1", the word lines W1 to Wd are precharged to $\frac{1}{3}$Vwr. Subsequently, the column drive control signal PY is set at "1" so that the bit lines B1 to Be are precharged to $\frac{2}{3}$Vwr. Next, the program/erase control signal WRE is set at "1" and, thereby, the output of one multiplexer MXXi (i=1 to d) linked to the selected word line that is connected to the selected memory cell to be programmed becomes the first word line voltage ax1, that is, VWR, and the outputs of all of the other multiplexers MXXj (j=1 to d, j≠i) linked to the unselected word lines other than the selected word line are maintained at the second word line voltage ax2, that is, $\frac{1}{3}$Vwr. In addition, the output of one multiplexer MXYk (k=1 to e) linked to the selected bit line, which is connected to the selected memory cell, becomes the first bit line voltage ay1, that is, 0 (V), and the outputs of all of the multiplexers MXY1 (l=1 to e, l≠k) of the unselected bit lines other than the selected bit line are maintained at the second bit line voltage ay2, that is, $\frac{2}{3}$Vwr. As a result of this, the voltage Vwr is applied across both ends of the selected memory cell so that the programming operation is carried out. On the other hand, though the voltage $\frac{1}{3}$Vwr is applied to all of the unselected memory cells, the voltage value is not notably high enough to change the resistance value of a variable resistive element, causing no disturbance. After that, the column drive control signal PY is set at "0" and subsequently, the row drive control signal PX is set at "0" so that the voltage application circuits 6 and 7 are respectively disconnected from the memory array 1 so as to complete the programming operation.

At the time of Din="0", the program/read switching signal WR is set at "1" so that the operation is in the erase mode. At this stage, ax1=0 (V) and ax2=⅔Vwr are selected as the output of the multiplexer MXX0 while ay1=Vwr and ay2=⅓Vwr are selected as the output of the multiplexer MXY0. During when the program/erase control signal WRE is 0, the second word voltage ax2, that is, ⅔Vwr is selected as the outputs of the multiplexers MXX1 to MXXd and the second bit line voltage ay2, that is, ⅓Vwr is selected as the outputs of the multiplexers MXY1 to MXYe. Next, the column drive control signal PY is set at "1" so that the bit lines B1 to Be are precharged to ⅓Vwr. Subsequently, the column drive control signal PX is set at "1" so that the word lines W1 to Wd are precharged to ⅔Vwr. Next, the program/ erase control signal WRE is set at "1" and, thereby, the output of one multiplexer MXXi (i=1 to d) linked to the selected word line that is connected to the selected memory cell to be erased is maintained at the first word line voltage ax1, that is, 0 (V), and the outputs of all of the multiplexers MXXj (j=1 to d, j≠i) linked to the unselected word lines other than the selected word line is maintained at the second word line voltage ax2, that is, ⅔Vwr. In addition, the output of one multiplexer MXYk (k= 1 to e) linked to the selected bit line which is connected to the selected memory cell becomes the first bit line voltage ay1, that is, Vwr, while the outputs of all of the multiplexers MXYl (l=1 to e, l≠k) of the unselected bit lines other than the selected bit line are maintained at the second bit line voltage ay2, that is, ⅓Vwr. As a result of this, the voltage Vwr is applied across both ends of the selected memory cell so that the erasing operation is carried out. On the other hand, though the voltage ⅓Vwr is applied to all of the unselected memory cells, the voltage value is not notably high enough to change the resistance value of a variable resistive element, causing no disturbance. After that, the row drive control signal PX is set at "0" and subsequently, the column drive control signal PY is set at "0" so that the voltage application circuits 6 and 7 are respectively disconnected from the memory array 1 so as to complete the erasing operation.

Figure 11:
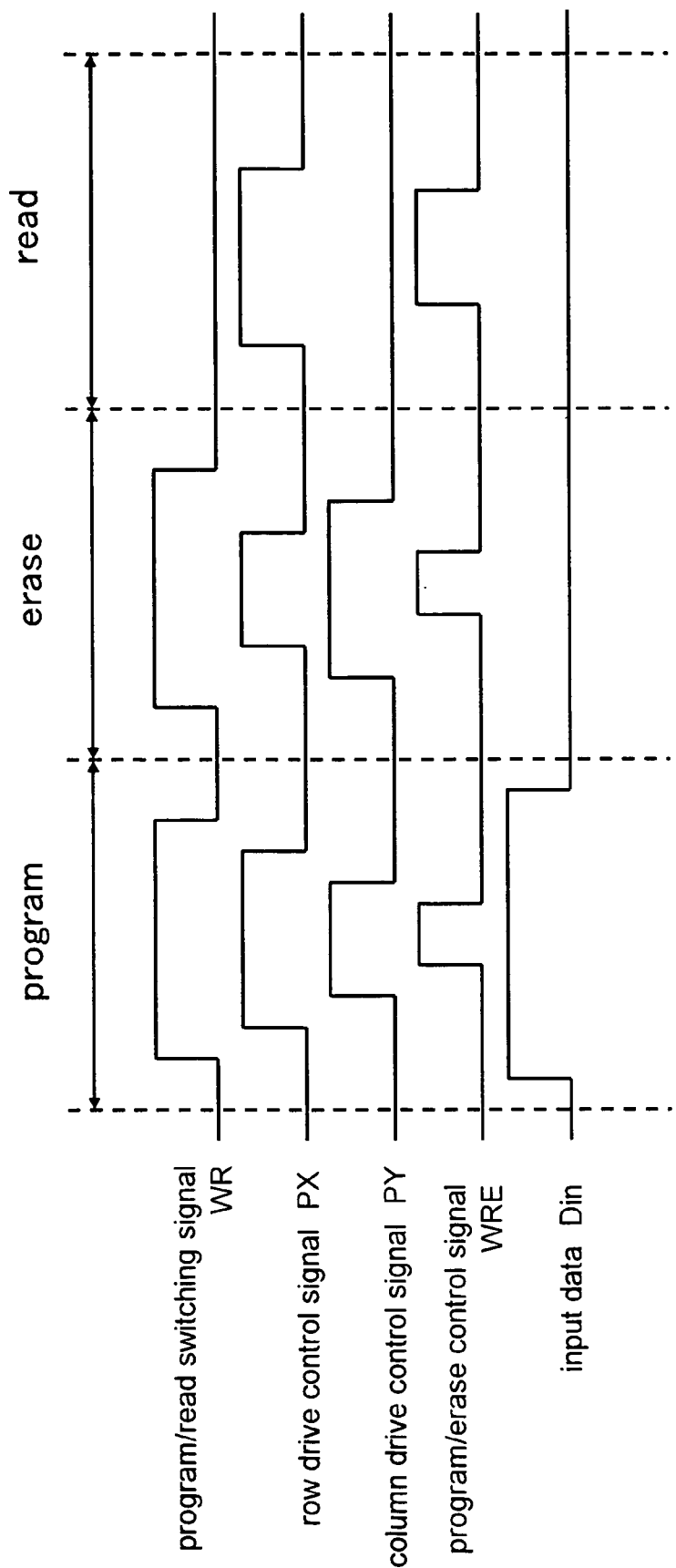
FIG. 11 is a timing chart showing main signal wave forms in programming, erasing and reading operations of the nonvolatile semiconductor memory device according to the present invention.

Here, the order of the shifting to "1" and "0" between the row drive control signal PX and the column drive control signal PY at the time of the programming and erasing operations is not limited to the order shown in FIG. 11. The row drive control signal PX and the column drive control signal PY are controlled so as to become "1" during the period when, and the period before and after, the program/ erase control signal WRE is "1".

When the program/read switching signal WR is set at "0", the operation is in the read mode. The transistors TR11 to TR1e of the read circuit 5 shown in FIG. 8 are switched to ON state so that the transistor TR2k (k=1 to e) linked to one bit line Bk (k=1 to e) connected to the selected memory cell to be read is turned on and, thus, the read circuit 5 is connected to the selected memory cell and, at the same time, ax1=⅓Vwr and ax2=0 (V) are selected as the output of the multiplexer MXX0. During when the program/erase control signal WRE is "0", the second word voltage ax2, that is, 0 (V) is selected as the outputs of the multiplexers MXX1 to MXXd. Subsequently, the row drive control signal PX is set at "1" so that the respective voltages of the word lines W1 to Wd are set at the second word voltage ax2, that is, 0 (V). Here, the program/erase control signal WRE is set at "1" and, thereby, the first word voltage ax1, that is, ⅓Vwr is selected as the output of one multiplexer MXXi (i=1 to d) linked to the selected word line that is connected to the selected memory cell, and is applied to the selected word line. A voltage that depends on the resistance state (high resistance or low resistance) of the selected memory cell appears in the selected bit line Bk (k=1 to e) connected to the selected memory cell and this bit line voltage is applied to the comparator CP1 through the transistors TR1k and TR2k so as to be compared with the reference voltage Vref, obtaining a data output Dout. Subsequently, the program/ erase control signal WRE is set at "0" and the row drive control signal PX is set at "0" so that the reading operation is completed.

Figure 12:
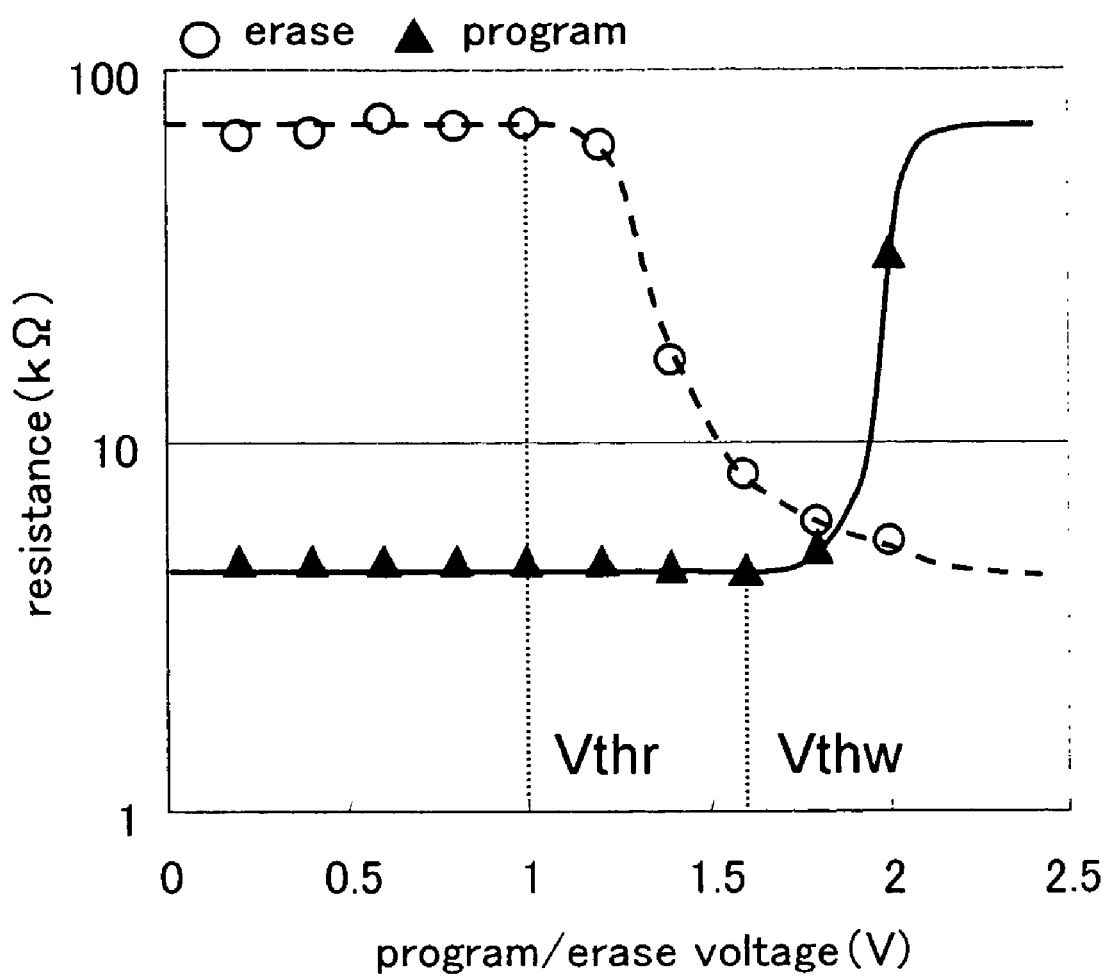
FIG. 12 is a characteristic graph showing one example of the relationships between the program and erase voltages and the resistance value of a variable resistive element used in the nonvolatile semiconductor memory device according to the present invention.

FIG. 12 shows the characteristics of a variable resistive element used in the inventive device 100 wherein the resistance value of the variable resistive element changes due to a voltage application. The solid line indicates the characteristics of transition from the low resistance state (erase state) to the high resistance state (program state) while the broken line indicates the characteristics of transition from the high resistance state to the low resistance state. The polarities of the applied voltage are opposite between at the time of programming and at the time of erasing. As shown in FIG. 12, a lower limit threshold voltage that causes a resistance change (that means a resistance change where the change in the resistance value exceeds a predetermined value, that is, a change in the resistance value to the degree of an error where the change can not substantially be read is ignored) exists both at the time of programming and at the time of erasing wherein this threshold voltage differs between at the time of programming and at the time of erasing. This has not been clear until this time when the experiments of the present inventors first revealed it. It is presumed that the threshold voltage where the resistance change occurs at the time of programming is denoted as a first threshold voltage (Vthw); the threshold voltage where the resistance change occurs at the time of erasing is denoted as a second threshold voltage (Vthr); and either one of the first and second threshold voltages of which the absolute value is smaller than that of the other, is denoted as Vth, and then, it is clear that the resistance state does not change regardless of programming or erasing when a voltage less than Vth is applied. The above described variable resistance material such as PCMO exhibits such characteristics where the resistance value changes. According to the present embodiment, the voltage value of third reference voltage ⅓Vwr is set at a value less than Vth.

Next, an example of the operation of a memory array that uses the same variable resistive elements as of the inventive device 100 will be described in detail using a 2×2=4 bit memory cell array.

Programming Operation

Figure 13:
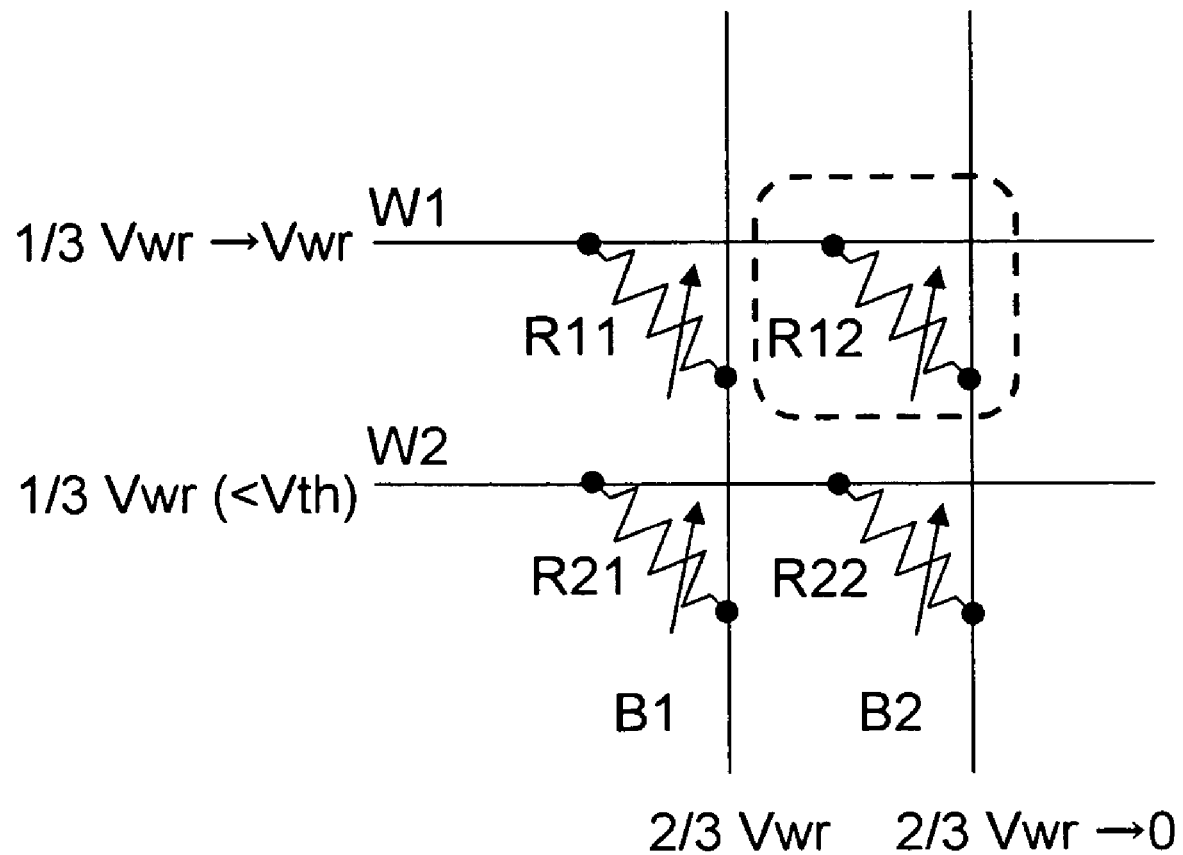
FIG. 13 is a diagram showing the programming operation of a 4-bit memory cell formed of a variable resistive element used in the nonvolatile semiconductor memory device according to the present invention.

The programming operation will be described below with reference to FIG. 13. In the case where programming is carried out on a variable resistive element R12, initially, the third reference voltage ⅓Vwr is applied to all of the word lines W1 and W2 while the second reference voltage ⅔Vwr is applied to all of the bit lines B1 and B2. Here, the third reference voltage ⅓Vwr is less than the threshold voltage Vth. At this time, a voltage less than the threshold voltage Vth is applied to all of the memory cells (variable resistive elements); therefore, no change occurs in the resistance. Next, the first reference voltage Vwr is applied to the selected word line W1 linked to the variable resistive element R12, which is the selected memory cell and the fourth reference voltage 0 (V) is applied to the selected bit line B2. At this time, the program voltage of Vwr (satisfying Vthw<Vwr<3 Vth) is applied across both ends of the variable resistive element R12 so that programming is carried out, converting the variable resistive element R12 to the high resistance state. A voltage less than Vth is applied to the variable resistive elements other than the variable resistive element R12; therefore, there is no change in the resistance. The resistance change characteristics shown in FIG. 12 exhibits Vth=1 V; therefore, the upper limit of the first reference voltage Vwr becomes 3 V.

Erasing Operation

Figure 14A:
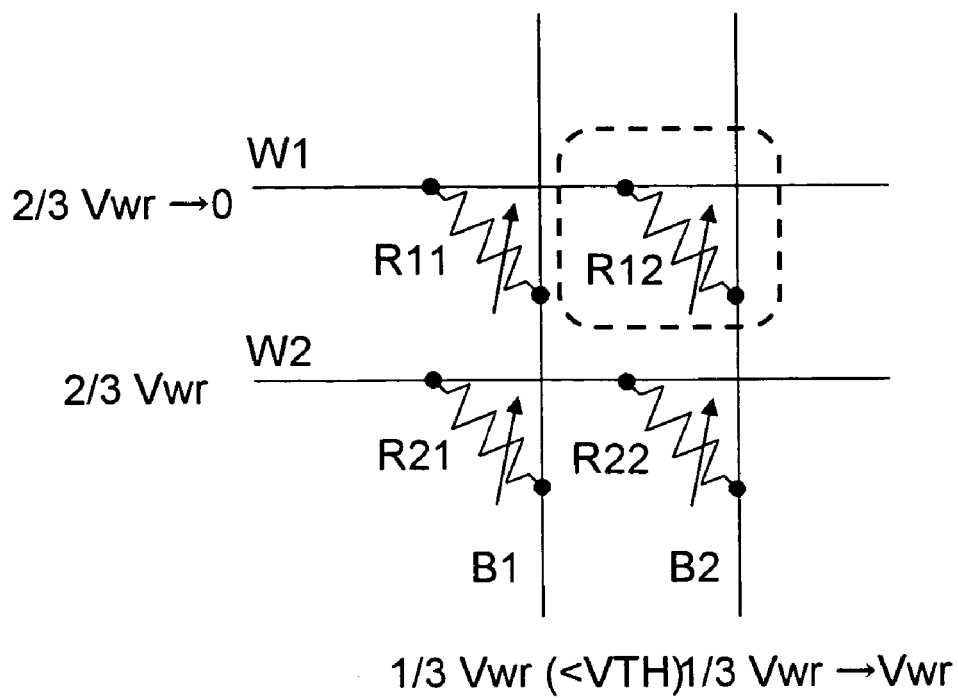
FIGS. 14A and 14B are diagrams showing the erasing operation of a 4-bit memory cell formed of a variable resistive element used in the nonvolatile semiconductor memory device according to the present invention.

The erasing operation will be described below with reference to FIG. 14A. In the case where the variable resistive element R12 is converted to the erase state, initially, the second reference voltage ⅔Vwr is applied to all of the word lines W1 and W2 while the third reference voltage ⅓Vwr is applied to all of the bit lines B1 and B2. Here, the third reference voltage ⅓Vwr is less than the threshold voltage Vth. At this time, a voltage less than the threshold voltage Vth is applied to all of the memory cells (variable resistive elements); therefore, there is no change in the resistance. Next, the fourth reference voltage 0 (V) is applied to the selected word line W1 linked to the variable resistive element R12, which is the selected memory cell, and the first reference voltage Vwr is applied to the selected bit line B2. At this time, the erase voltage of Vwr (satisfying Vthr<Vwr<3 Vth) is applied across both ends of the variable resistive element R12 so that erasing is carried out, converting the variable resistive element R12 to the low resistance state. The polarities of this erase voltage are opposite to those at the time of programming. In addition, a voltage less than Vth is applied to the variable resistive elements other than the variable resistive element R12; therefore, there is no change in the resistance. According to the characteristics shown in FIG. 12, Vth=1 V; therefore, the upper limit of Vwr is 3 V.

Figure 14B:
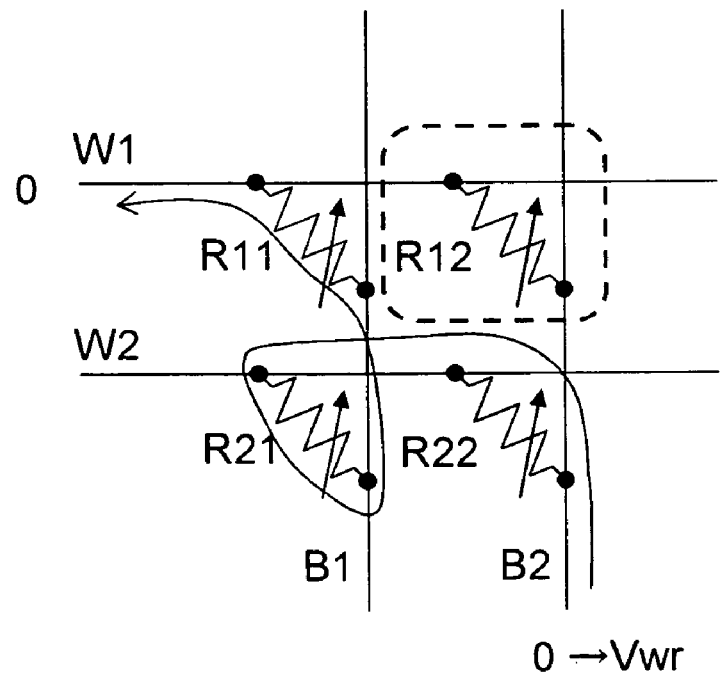

Here, as shown in FIG. 14B, when the above-described voltage is applied to only the selected word line W1 and the selected bit line B2 connected to the variable resistive element R12 of the selected memory cell while the other unselected word line W2 and the unselected bit line B1 are in a floating state, disturbance might occur in some cases. As indicated by the arrow in FIG. 14B, the program voltage Vwr is applied across the portion where the variable resistive elements R11, R21 and R22 of the three unselected memory cells are connected in series; therefore, in the case where the variable resistive elements R11 and R21 are in the low resistance state while the variable resistive element R22 is in the high resistance state, for example, the major portion of Vwr is applied to the variable resistive element R22 so that erasing is carried out on the variable resistive element R22.

Reading Operation

Figure 15:
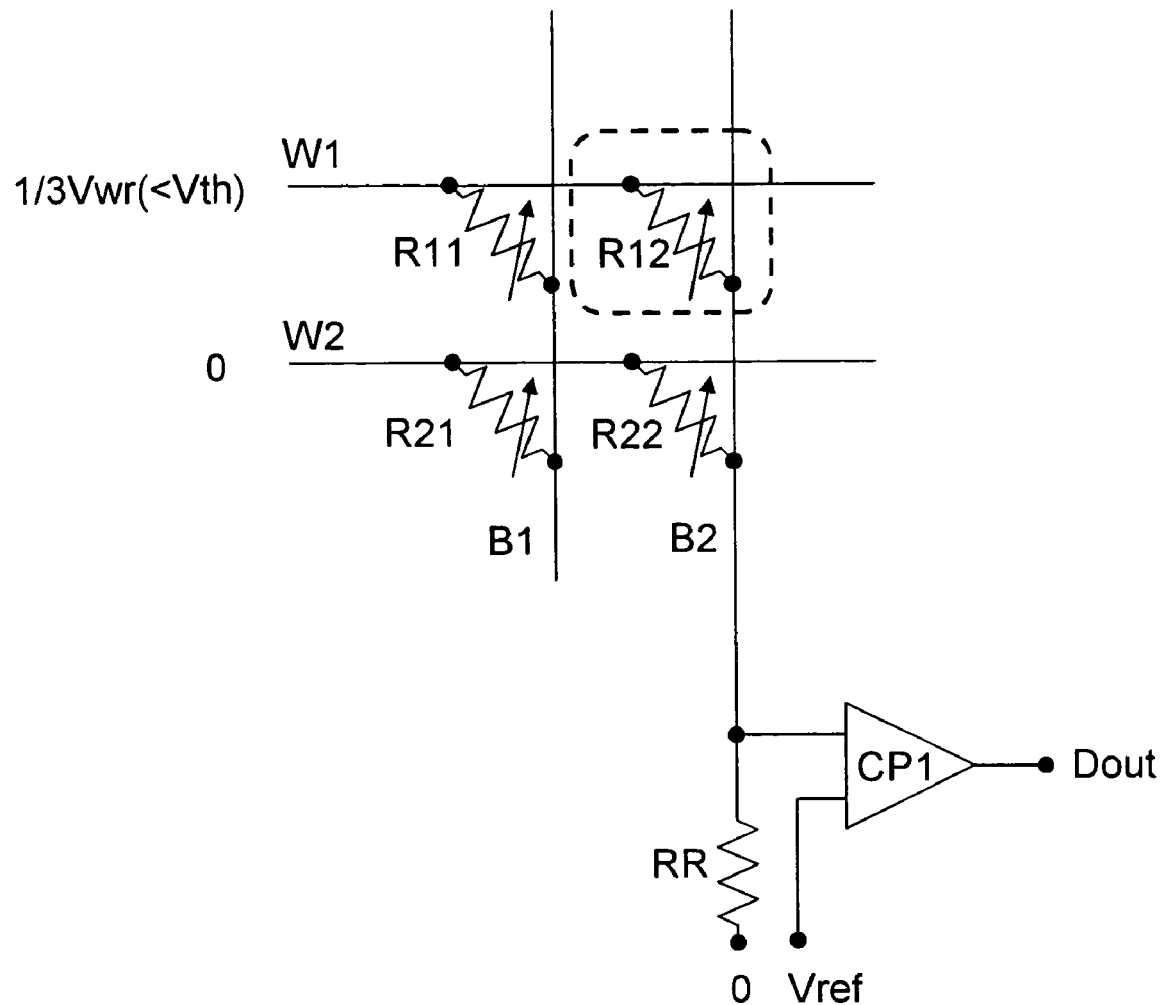
FIG. 15 is a diagram showing the reading operation of a 4-bit memory cell formed of a variable resistive element used in the nonvolatile semiconductor memory device according to the present invention.

The reading operation will be described below with reference to FIG. 15. In the case where the resistance state of the variable resistive element R12 is read, the third reference voltage ⅓Vwr, which is read voltage VR, is applied to the selected word line W1 while a fixed voltage of 0 V (which is the same as the fourth reference voltage) is applied to the other unselected word line W2. The third reference voltage ⅓Vwr that is the read voltage is set at a value less than the threshold voltage Vth as described above. As a result, all of the voltages applied to the variable resistive elements are less than the threshold voltage Vth, causing no resistance change (disturbance) of the variable resistive elements due to the application of the read voltage. The read signal is read by means of the bit line B2. At the time of reading, a fixed resistor RR is connected to the selected bit line to be read via the transistors TR1k and TR2k (not shown in FIG. 15) shown in FIG. 8 while a fixed voltage of 0 V (same as the fourth reference voltage) that has been applied to the unselected word line W2 is applied to the terminal of the fixed resistor RR on the side opposite to the selected bit line B2. At this time, the voltage Vout2 that appears in the bit line B2 can be represented by the following formula (1) when the on resistances of the transistors TR1k and TR2k are ignored.

$$Vout2 = V_R \times RR \times R22 / (RR \times R12 + R12 \times R22 + R22 \times R02) \quad (1)$$

Here, it is presumed that the resistance value of a variable resistive element in the high resistance state is RH; the resistance value of a variable resistive element in the low resistance state is RL; the ratio of the resistance value in the high resistance state to the resistance value in the low resistance state is k=RH/RL; and the resistance value RR of the fixed resistor RR is RL which is the same resistance value of a variable resistive element in the low resistance state. It is also presumed that Vout2 is a function of resistance values R12 and R13 of the variable resistive elements R12 and R22 so as to be represented as Vout2 (R12, R22) and then, the following formulas (2a) to (2d) and Table 3 are obtained in accordance with the resistance values R12 and R13.

$$Vout2\ (RH, RH) = V_R \times RL / (2RL + RH) \quad (2a)$$
$$= V_R / (2 + k)$$

$$Vout2\ (RL, RL) = V_R / 3 \quad (2b)$$

$$Vout2\ (RH, RL) = V_R \times RL / (2RH + RL) \quad (2c)$$
$$= V_R / (2k + 1)$$

$$Vout2\ (RL, RH) = V_R \times RH / (RL + 2RH) \quad (2d)$$
$$= V_R \times k / (2k + 1)$$

TABLE 3

|  |  | R12 | |
|---|---|---|---|
|  |  | RL | RH |
| R22 | RL | $V_R/3$ | $V_R/(2k+1)$ |
|  | RH | $V_R \times k/(2k+1)$ | $V_R/(2+k)$ |

According to the characteristics of FIG. 12, k is approximately 10 and Vout2 in the case where the read voltage is, for example, 1 V is shown in Table 4. The relationship shown in formula (3) has been obtained from formulas (2a) to (2d) as well as Tables 3 and 4.

TABLE 4

| $V_R = 1$ V | | R12 | |
|---|---|---|---|
| k = 10 |  | RL | RH |
| R22 | RL | 0.333 [V] | 0.048 [V] |
|  | RH | 0.476 [V] | 0.083 [V] |

Vout2 (RL, RH)>Vout2 (RL, RL)>Vout2 (RH, RH)>Vout2 (RH, RL) (3)

As is clear from formula (3), a reference voltage Vref is set at a value between Vout2 (RL, RL) and Vout2 (RH, RH) so that the resistance state of R12 can be determined depending on whether Vout2 is greater or smaller than Vref.

Here, though the 2×2=4 bit memory cell array is used in the above description, the formulas (2a) and (2b) are altered as shown in the formulas (4a) and (4b), respectively, when the number of word lines is presumed to be "d". Accordingly, the size relationship shown in formula (3) is maintained, making a theoretical reading possible, while the voltage values of Vout2 (RL, RL) and Vout2 (RH, RH) and the voltage difference between them are reduced as the number d of the word lines is increased; therefore, the read margin is reduced, indicating the existence of the upper limit of the number d of the word lines due to the restriction of the operational margin.

$$Vout2\ (RH, RH) = VR/(d+k) \quad (4a)$$

$$Vout2\ (RL, RL,) = VR/(d+1) \quad (4b)$$

Second Embodiment

In the first embodiment, the voltage is applied to all variable resistive elements 22 that form the memory array 1 so that a current flows through the entirety of the memory cells; therefore, consumed power increases when the memory array becomes large in scale. In addition, as described in the first embodiment, it becomes difficult for the read circuit to determine the program state and the erase state when the number of word lines increases. Therefore, the configuration, in which the memory array 1 is divided so that the divided memory arrays are driven, is shown in a second embodiment.

Figure 16:
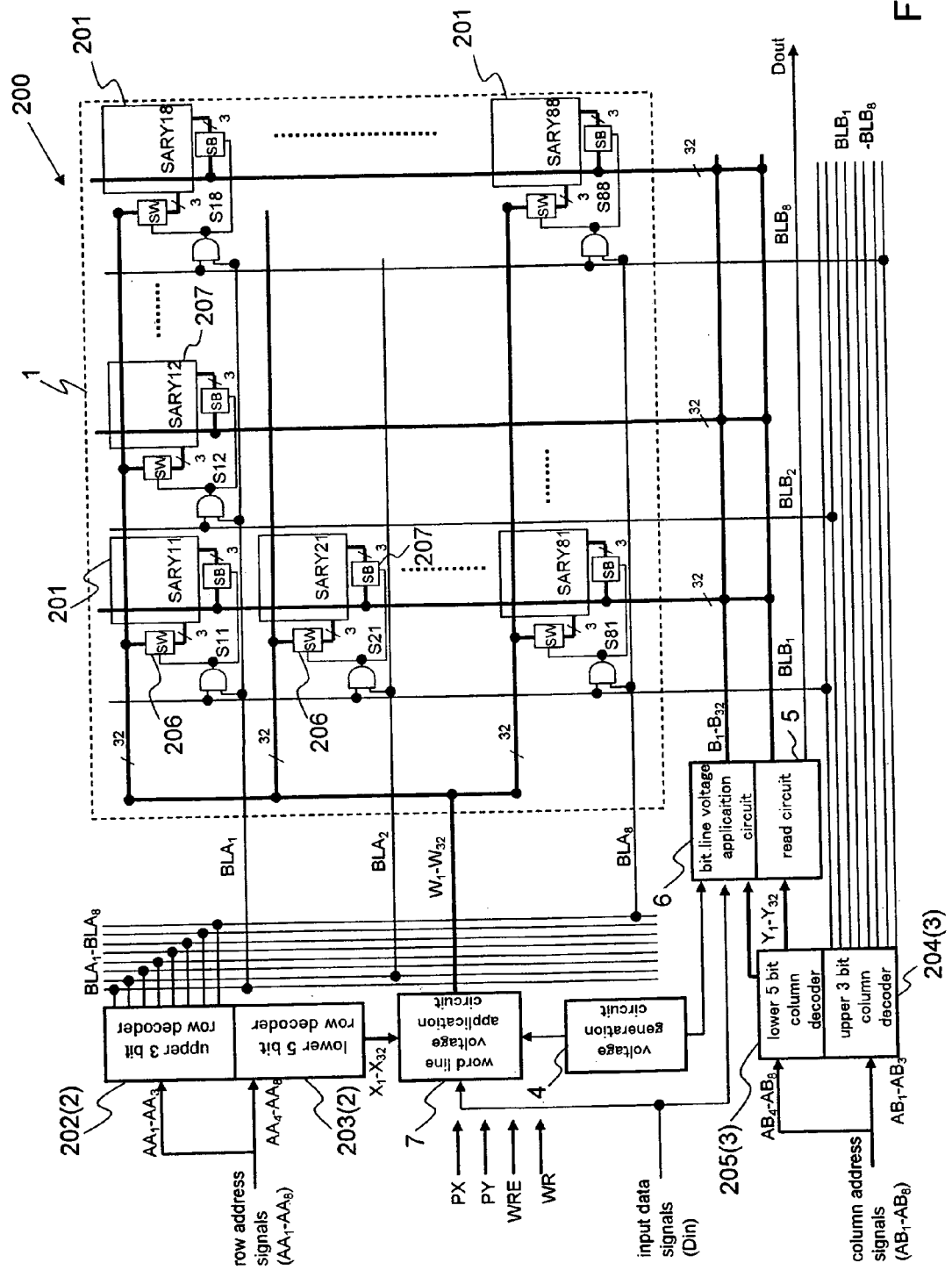
FIG. 16 is a function block configuration diagram showing a functional block configuration of another embodiment of the nonvolatile semiconductor memory device according to the present invention.

FIG. 16 is a block configuration diagram showing a function configuration according to the second embodiment of an inventive device 200. In the second embodiment, the memory array 1 in the first embodiment is divided into a plurality of sub-arrays 201 so that each sub-array 201 can be accessed. FIG. 16 shows an example of a case wherein a 64 k bit memory having 8 bits for the row address and 8 bits for the column address for a total of a 16 bit address signal as an input is formed.

The inventive device 200 differs from the first embodiment in that the memory array 1 is formed of the plurality of sub-arrays 201 and the row decoder 2 (202, 203) and the column decoder 3 (204, 205) are respectively formed of upper 3 bit decoders 202, 204 and lower 5 bit decoders 203, 205. The voltage generation circuit 4, the read circuit 5, the bit line voltage application circuit 6 and the word line voltage application circuit 7 are exactly the same as in the first embodiment.

Figure 17:
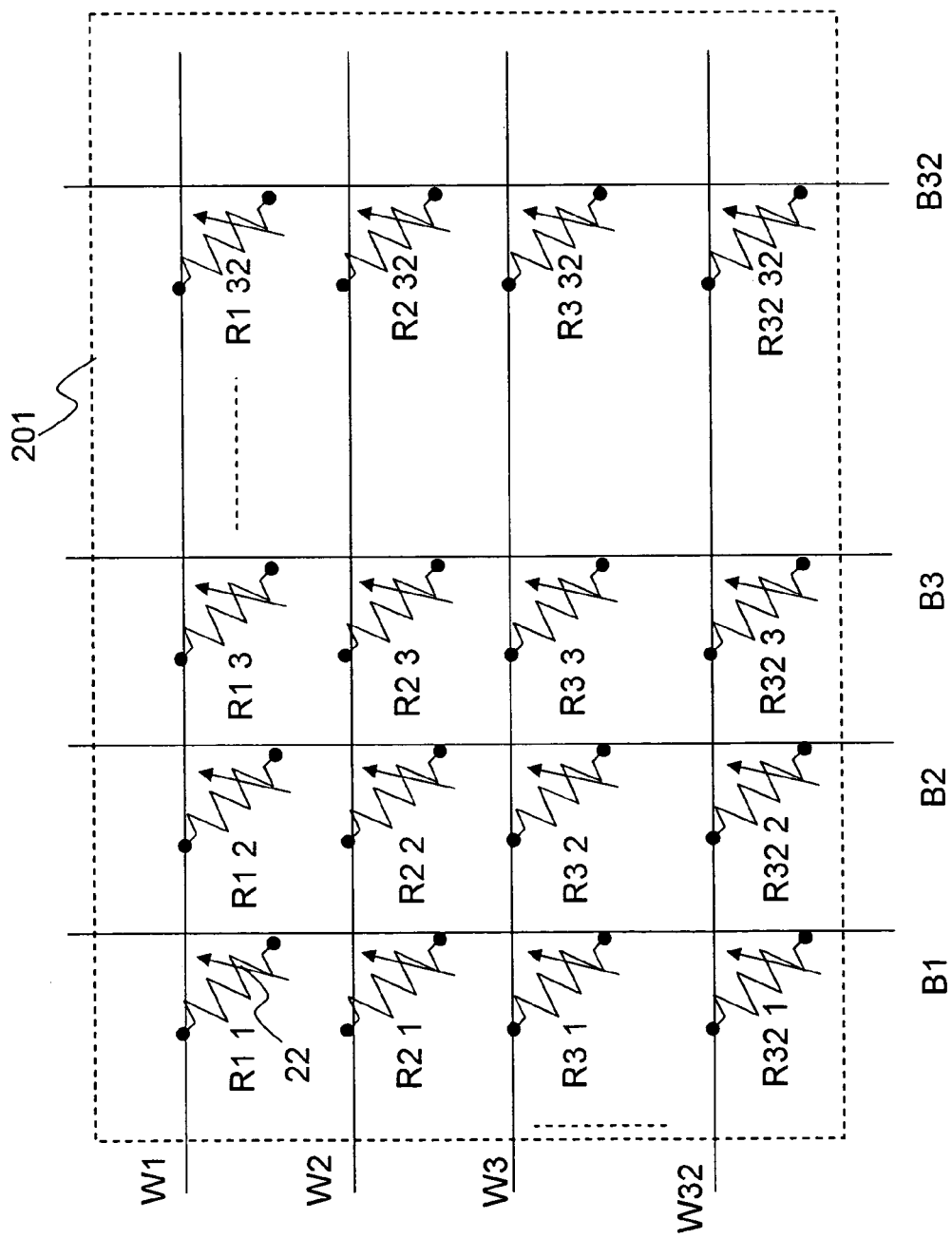
FIG. 17 is a circuit diagram showing one configuration example of a sub-array in accordance with another embodiment of the nonvolatile semiconductor memory device according to the present invention.

As shown in FIG. 17, the sub-array 201 has 32 word lines, 32 bit lines and variable resistive elements Rij (i=1 to 8, j=1 to 8) electrically connected to the crossing points of the word lines and the bit lines, which corresponds to the case where d=32 and e=32 in the memory array 1 according to the first embodiment.

Figure 18:
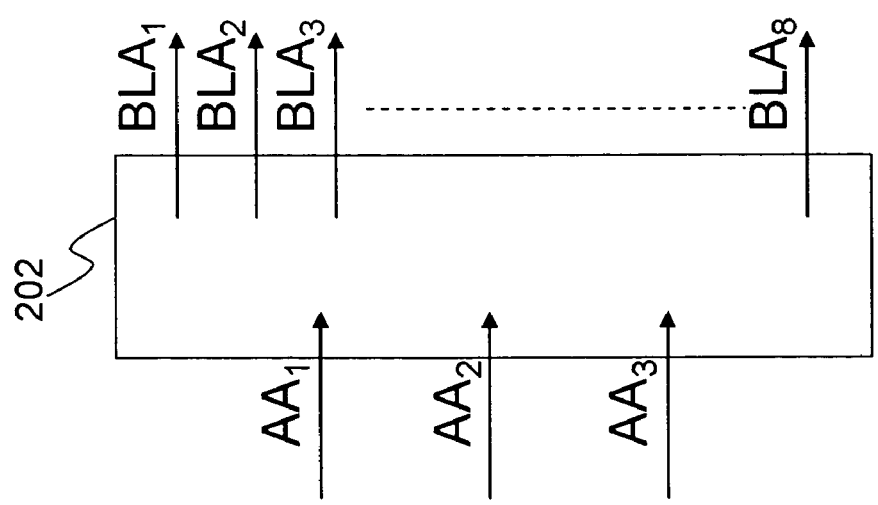
FIG. 18 is a diagram showing the configuration of an upper 3-bit row decoder and the relationships between the row address signals and the outputs of the row decoder in accordance with another embodiment of the nonvolatile semiconductor memory device according to the present invention.
Figure 19:
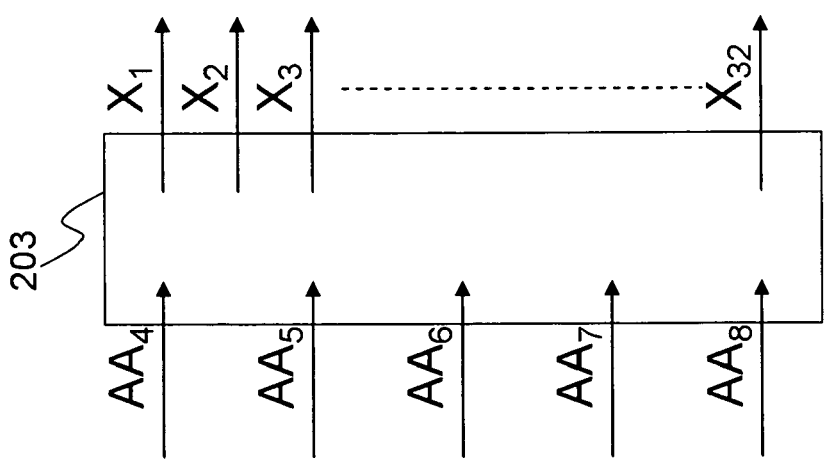
FIG. 19 is a diagram showing the configuration of a lower 5-bit row decoder and the relationships between the row address signals and the outputs of the row decoder in accordance with another embodiment of the nonvolatile semiconductor memory device according to the present invention.

Upper 3 bits AA1 to AA3 of 8 bit row address signals AA1 to AA8 are inputted into the upper 3 bit row decoder 202 and the lower 5 bits are inputted into the lower 5 bit row decoder 203. The upper 3 bit row decoder 202 has the 3 bit address signal inputs AA1 to AA3 and outputs BLA1 to BLA8 as shown in FIG. 18. "1" is outputted to only one selected from among BLA1 to BLA8 by the input address, as shown in the figure, while 0 is outputted to the rest. These BLA1 to BLA8 are used for the selection of the sub-array 201. The lower 5 bit row decoder 203 has 5 bit address signal inputs AA4 to AA8 and outputs X1 to X32 as shown in FIG. 19. "1" is outputted to only one selected from among X1 to X32 by the input address, as shown in the figure, while 0 is outputted to the rest. X1 to X32 are inputted into the word line voltage application circuit 7.

Figure 20:
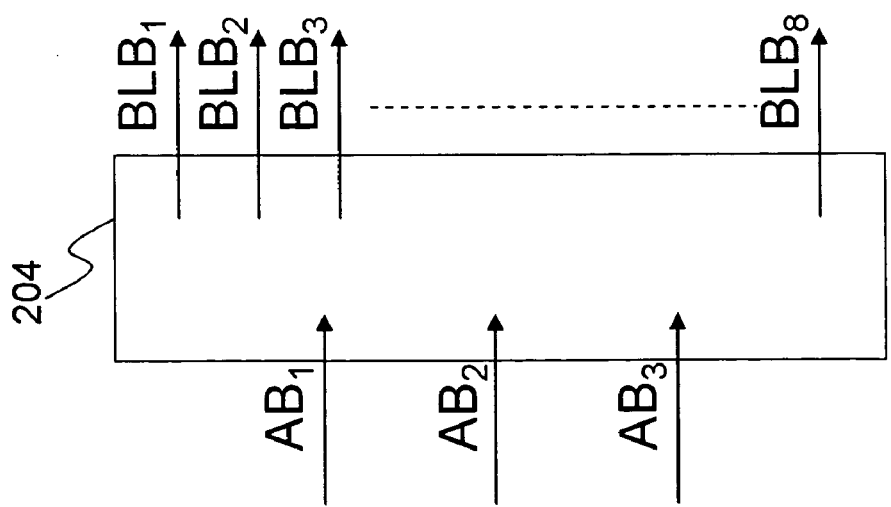
FIG. 20 is a diagram showing the configuration of an upper 3-bit column decoder and the relationships between the column address signals and the outputs of the column decoder in accordance with another embodiment of the nonvolatile semiconductor memory device according to the present invention.
Figure 21:
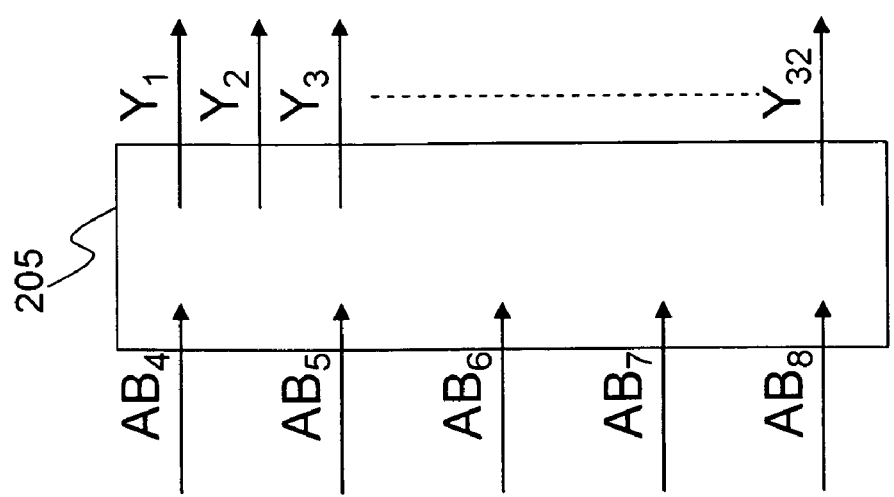
FIG. 21 is a diagram showing the configuration of a lower 5-bit column decoder and the relationships between the column address signals and the outputs of the column decoder in accordance with another embodiment of the nonvolatile semiconductor memory device according to the present invention.

Upper 3 bits AB1 to AB3 of 8 bit column address signals AB1 to AB8 are inputted into the upper 3 bit column decoder 204 and the lower 5 bits are inputted into the lower 5 bit column decoder 205. The upper 3 bit column decoder 204 has 3 bit address signal inputs AB1 to AB3 and outputs BLB1 to BLB8 as shown in FIG. 20. "1" is outputted to only one selected from among BLB1 to BLB8 by the input address, as shown in the figure, while 0 is outputted to the rest. These BLB1 to BLB8 are used for the selection of the sub-array 201. The lower 5 bit column decoder 205 has 5 bit address signal inputs AB4 to AB8 and outputs Y1 to Y32 as shown in FIG. 21. "1" is outputted to only one selected from among Y1 to Y32 by the input address, as shown in the figure, while 0 is outputted to the rest. Y1 to Y32 are inputted into the bit line voltage application circuit 6.

Figure 22:
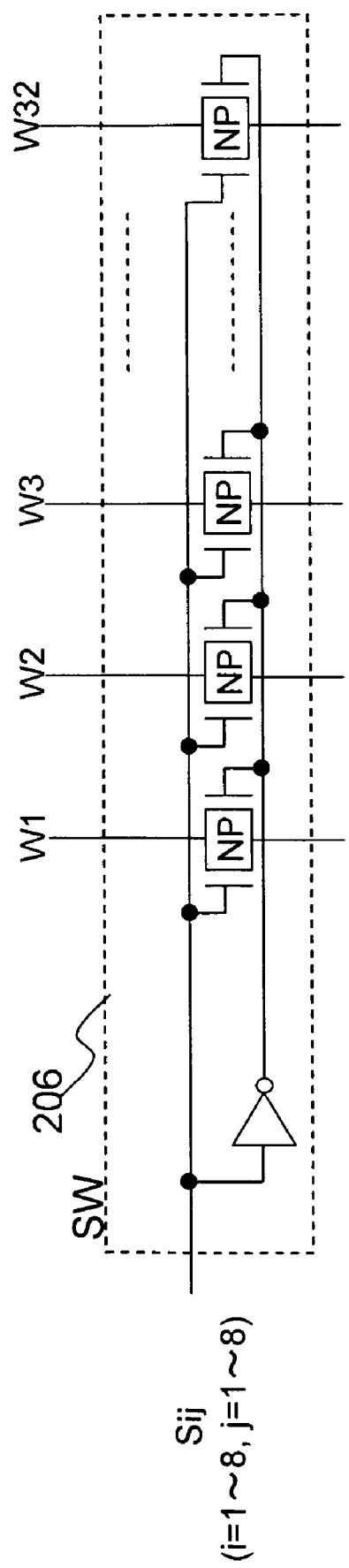
FIG. 22 is a circuit diagram showing one configuration example of a word line connection switch in accordance with another embodiment of the nonvolatile semiconductor memory device according to the present invention.

SW206 in FIG. 16 is a word line connection switch for transmitting the output of the word line voltage application circuit 7 to the word lines W1 to W32 of the selected sub-array 201 and the output of the word line voltage application circuit 7 is transmitted to the word lines W1 to W32 of the selected sub-array 201 when the sub-array selection signal Sij (i=1 to 8, j=1 to 8) is "1" as shown in FIG. 22.

Figure 23:
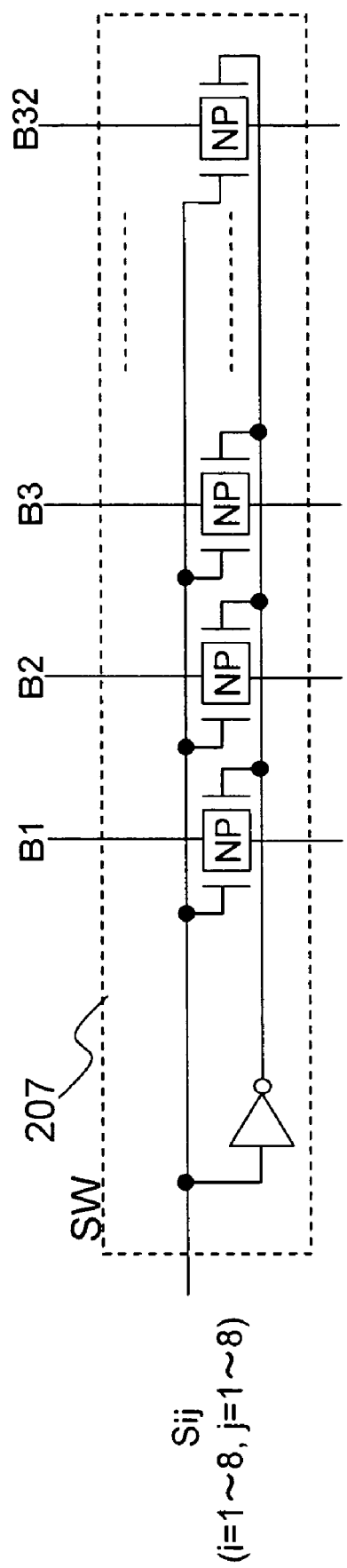
FIG. 23 is a circuit diagram showing one configuration example of a bit line connection switch in accordance with another embodiment of the nonvolatile semiconductor memory device according to the present invention.

SB207 in FIG. 16 is a bit line connection switch for transmitting the output of the bit line voltage application circuit 6 to the bit lines B1 to B32 of the selected sub-array 201 and the output of the bit line voltage application circuit 6 is transmitted to the bit lines B1 to B32 of the selected sub-array 201 when the sub-array selection signal Sij (i=1 to 8, j=1 to 8) is "1" as shown in FIG. 23.

The sub-array selection signal Sij (i=1 to 8, j=1 to 8), which is inputted to the word line connection switch SW206 and the bit line connection switch SB207, is generated from the outputs BLA1 to BLA8 of the upper 3 bit row decoder 202 and the outputs BLB1 to BLB8 of the upper 3 bit column decoder 204. Sij (i=1 to 8, j=1 to 8) is provided as the logical product of BLAi (i=1 to 8) and BLBj (j=1 to 8). "1" is outputted from only one from among BLA1 to BLA8 and "1" is outputted from only one from among BLB1 to BLB8; therefore, only one from among 8×8=64 Sij (i=1 to 8, j=1 to 8) becomes "1" so that only one sub-array from among 64 sub-arrays SARYji (i=1 to 8, j=1 to 8) is selected; thus, the output of the word line voltage application circuit 7 and the output of the bit line voltage application circuit 6 are respectively transmitted to each selected one sub-array 201.

The operations other than the selection of a sub-array are the same as in the first embodiment; therefore, an address signal is set concretely so that only the operation at the time of programming will be briefly described below. AA1 to AA8 '(10010000) is, for example, inputted as an 8 bit row address signal, AB1 to AB8=(01001000) is, for example, inputted as an 8 bit column address signal and Din (="1") is, for example, inputted as programming data. AA1 to AA3= (100) are inputted into the upper 3 bit row decoder 202 so that the decode outputs BLA1 to BLA8=(01000000) are outputted. In the same manner, AB1 to AB3=(010) are inputted into the upper 3 bit column decoder 204 so that the decode outputs BLB1 to BLB8=(00100000) are obtained. Therefore, only BLA2 and BLB3 become "1" and the rest becomes "0" ; therefore, S23 that has BLA2 and BLB3 as the inputs of an AND circuit from among the sub-array selection signals Sij (i=1 to 8, j=1 to 8) becomes "1." As a result, only the word line connection switch SW 206 and the bit line connection switch SB207 connected to the sub-array SARY23 are turned on so that a standby condition is achieved wherein the output of the word line voltage application circuit 7 and the output of the bit line voltage application circuit 6 are respectively ready to be transferred to the word lines W1 to W32 and the bit lines B1 to B32 of SARY23. In addition, since AA4 to AA8=(10000) and AB4 to AB8=(01000), the lower 5 bit row decoder 203 and the lower 5 bit column decoder output 205 become X2=1, Xi=0 (i≠2), Y3=1 and Yj=0 (j≠3). Accordingly, the memo where programming is carried out is R23 in the sub-array SARY23.

After this, the programming operation is carried out according to the timing chart of FIG. 11. Since Din=1, the operation goes into the program mode by setting the program/read switching signal WR at "1." While the program/erase control signal WRE is "0," the word line precharge voltage ⅓Vwr is prepared as the output of the word line voltage application circuit 7 and the bit line precharge voltage ⅔Vwr is prepared as the output of the bit line voltage application circuit 6. Next, the row precharge signal PX is set at "1" so that the word line precharge voltage ⅓Vwr is applied to the word lines W1 to W32 of the sub-array SARY23. Next, the column precharge signal PY is set at "1" so that ⅔Vwr is applied to the bit lines B1 to B32 of the sub-array SARY23. Next, program/erase control signal WRE is set at "1" and, thereby, only the voltage applied to the word line W2 is raised to Vwr and only the voltage applied to the bit line B3 is lowered to 0. As a result, the program voltage Vwr is applied to R23 so that programming is carried out. After that, the word line voltage application circuit 7 and the bit line voltage application circuit 6 are separated from the memory array 1 by making WRE="0," PY="0" and PX="0" so that the programming operation is completed.

Next, other embodiments of the inventive device 100 will be described.

(1) In the above embodiments, the voltage generation circuit 4 shown in FIG. 7 generates the second and third reference voltages by dividing the voltage difference between the first and fourth reference voltages equally into three, making the two intermediate voltages so that each of the voltage differences between the first, second, third and fourth reference voltages becomes ⅓Vwr. According to this method, the voltage difference between the first word line voltage ax1 and the second bit line voltage ay2, the voltage difference between the second word line voltage ax2 and the first bit line voltage ay1 and the voltage difference between the second word line voltage ax2 and the second bit line voltage ay2 are become equal to one another at the time of programming and erasing operations and the voltage ⅓Vwr is applied equally to all of the unselected memory cells. Therefore, all of the unselected memory cells have equal voltage margins for disturbance in the case where all of the unselected memory cells have the same resistance change characteristics, thus obtaining a rational method for generating a reference voltage concerning measures against disturbers.

In contrast to the above, in another embodiment, the voltage difference between the second and third reference voltages may become smaller than the voltage difference between the first and second reference voltages and the voltage difference between the third and fourth reference voltages in the voltage generation circuit 4 while satisfying these three conditions: the relationship between the voltages is in the order of first, second, third and fourth reference voltages; the voltage differences between the adjacent reference voltages are less than the threshold voltage Vth; and the voltage difference between the first and fourth reference voltages is sufficient enough to change the resistance of a valuable resistive element. That is, the resistance value of the middle resistor of the three resistors connected in series in the voltage generation circuit 4 shown in FIG. 7 is relatively lower than the resistance values of the other two resistors. As a result, the voltage difference between the first word line voltage ax1 and the second bit line voltage ay2, and the voltage difference between the second word line voltage ax2 and the first bit line voltage ay1 become greater than the voltage difference between the second word line voltage ax2 and the second bit line voltage ay2 at the time of programming and erasing operations. That is, the voltage ⅓Vwr is not equally applied to all of the unselected memory cells unlike the above embodiment, but rather the voltage applied to first unselected memory cells which are connected to both the unselected word lines and unselected bit lines occupying the major portion of the unselected memory cells becomes lower than the voltage connected to the minority second unselected memory cells of which one terminal is connected to either the selected word line or the selected bit line in the case where the number of the memory cells that form the memory array is great; therefore, the current that flows through the entirety of the unselected memory cells can be made small. Therefore, reduction in the consumed power at the time of programming and erasing operations can further be achieved in the voltage generation circuit according to this modified embodiment.

Furthermore, as a special case of the modified embodiment, the voltage difference between the second and third reference voltages may be 0 V, that is, the second and third reference voltages may be the same voltage as long as the above-described three conditions are satisfied.

(2) In the above embodiments, the valuable resistive elements are presumed to have characteristics as shown in FIG. 12 wherein the first threshold voltage (Vthw), which is the threshold voltage causing a resistance change at the time of programming, and the second threshold voltage (Vthr), which is the threshold voltage causing a resistance change at the time of erasing, are different from one another. However, even in the case where variable resistive elements of which the first threshold voltage (Vthw) and the second threshold voltage (Vthr) are the same are used, the voltage levels of the first word line voltage, the second word line voltage, the first bit line voltage and the second bit line voltage, respectively applied to the selected word line, the unselected word lines, the selected bit line and the unselected bit lines can be selected in the same manner as in the above embodiments by means of the voltage generation circuit 4, the word line voltage application circuit 7 and the bit line voltage application circuit 6 of the inventive device 100 so that the same effects as in the above embodiments can be obtained when these threshold voltages Vth are not 0 V and the resistance value of a variable resistive element is changed by a voltage two to three times higher than these threshold voltages.

(3) Though the sub-arrays 201 have 32 bit×32 bit configurations in the second embodiment, this is an example and the present invention is not limited to this configuration. Accordingly, the method for generating a sub-array selecting signal by dividing the address signal is not limited to 3 bits or 5 bits. Furthermore, though the capacity is 64 k bits in the second embodiment, this is an example and the present invention is not limited to this.

As described above in detail, in accordance with the nonvolatile semiconductor memory device and programming and erasing methods thereof according to the present invention, the lower limit threshold voltages that cause a resistance change in a variable resistive element in response to the applied voltage exist respectively at the time of programming and erasing, and the characteristics of the variable resistive elements, wherein these threshold voltages differ at the time of programming and erasing, are utilized while the smaller threshold voltage between the threshold voltage at the time of programming and the threshold voltage at the time of erasing is referred to as Vth so that a voltage less than this threshold voltage Vth is applied across both ends of the variable resistive element of an unselected memory cell, thus, no disturbance problem arises. In addition, no cell selecting elements are provided with the memory cells; therefore, the areas of the memory cells can be reduced, making an increase in the integration easy and possible.

Furthermore, it is possible to divide the memory array part into a plurality of sub-arrays in the nonvolatile semiconductor device according to the present invention so that the consumed power is reduced by accessing only one sub-array.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
   a memory array formed of a plurality of memory cells, each having a variable resistive element of which the resistance value is changed in a reversible manner by applying a voltage, aligned in the directions of rows and columns, respectively, in a manner where one end of each memory cell in the same row is connected to the same word line while the other end of each memory cell in the same column is connected to the same bit line;
   a word line voltage application circuit formed so that one type of word line voltage can be selected from among a plurality of types to be applied to each of said word lines; and
   a bit line voltage application circuit formed so that one type of bit line voltage can be selected from among a plurality of types to be applied to each of said bit lines, wherein
   said word line voltage application circuit selects a first word line voltage at the time of programming or erasing operation so that the first word line voltage is applied to the selected word line that is connected to a selected memory cell to be programmed or erased, and selects a second word line voltage so that the second word line voltage is applied to the unselected word lines other than said selected word line,
   said bit line voltage application circuit selects a first bit line voltage at the time of programming or erasing operation so that the first bit line voltage is applied to the selected bit line that is connected to a selected memory cell to be programmed or erased, and selects a second bit line voltage so that the second bit line voltage is applied to the unselected bit lines other than said selected bit line, and
   said first word line voltage, said second word line voltage, said first bit line voltage and said second bit line voltage have particular voltage values in accordance with the programming or erasing operation so that the voltage difference between said first word line voltage and said first bit line voltage is set at a value equal to or more than a first voltage difference which allows the resistance value of said variable resistive element to exceed a predetermined value as a result of a change in the case where the first voltage difference is applied across both ends of said variable resistive element and so that the voltage difference between said first word line voltage and said second bit line voltage, the voltage difference between said second word line voltage and said first bit line voltage and the voltage difference between said second word line voltage and said second bit line voltage are respectively set at values equal to or less than a second voltage difference which does not allow the resistance value of said variable resistive element to exceed a predetermined value as a result of a change in the case where the second voltage difference is applied across the both ends of said variable resistive element.

2. The nonvolatile semiconductor memory device according to claim 1, wherein
   said word line voltage application circuit selects said second word line voltage before the start of the programming or erasing operation of said memory array so that the second word line voltage is applied to all of said word lines of said memory array, and
   said bit line voltage application circuit selects said second bit line voltage before the start of the programming or erasing operation of said memory array so that the second bit line voltage is applied to all of said bit lines of said memory array.

3. The nonvolatile semiconductor memory device according to claim 1, wherein
   said variable resistive element has resistance varying characteristics where the resistance value increases so as to exceed a predetermined value when a voltage which is equal to or more than a first threshold voltage is applied across both ends of the variable resistive element and the resistance value decreases so as to exceed a predetermined value when a voltage which is equal to or more than a second threshold voltage of which the polarities are reversed from those of said first threshold voltage is applied across both ends of the variable resistive element, and
   said second voltage difference is set at a value lower than the threshold voltage which is the lower of either said first threshold voltage or said second threshold voltage.

4. The nonvolatile semiconductor memory device according to claim 3, wherein
   said second threshold voltage is lower than said first threshold voltage.

5. The nonvolatile semiconductor memory device according to claim 1, wherein
   said first word line voltage, said second word line voltage, said first bit line voltage and said second bit line voltage at the time of programming operation are set as follows: said first word line voltage is higher than said second bit line voltage; said second bit line voltage is no less than said second word line voltage; and said second word line voltage is higher than said first bit line voltage.

6. The nonvolatile semiconductor memory device according to claim 5, wherein
   the voltage difference between said first word line voltage and said second bit line voltage, the voltage difference between said second word line voltage and said first bit line voltage and the voltage difference between said second word line voltage and said second bit line voltage are equal to one another.

7. The nonvolatile semiconductor memory device according to claim 5, wherein
   the voltage difference between said first word line voltage and said second bit line voltage and the voltage difference between said second word line voltage and said first bit line voltage are greater than the voltage difference between said second word line voltage and said second bit line voltage.

8. The nonvolatile semiconductor memory device according to claim 1, wherein
said first word line voltage, said second word line voltage, said first bit line voltage and said second bit line voltage at the time of erasing operation are as follows: said first word line voltage is lower than said second bit line voltage; said second bit line voltage is no more than said second word line voltage; and said second word line voltage is lower than said first bit line voltage.

9. The nonvolatile semiconductor memory device according to claim 8, wherein
the voltage difference between said first word line voltage and said second bit line voltage, the voltage difference between said second word line voltage and said first bit line voltage and the voltage difference between said second word line voltage and said second bit line voltage are equal to one another.

10. The nonvolatile semiconductor memory device according to claim 8, wherein
the voltage difference between said first word line voltage and said second bit line voltage and the voltage difference between said second word line voltage and said first bit line voltage is greater than the voltage difference between said second word line voltage and said second bit line voltage.

11. The nonvolatile semiconductor memory device according to claim 1, wherein
said variable resistive element is made of an oxide having a perovskite structure that contains manganese.

12. The nonvolatile semiconductor memory device according to claim 1, comprising:
a bit line selector circuit for selecting a bit line connected to a selected memory cell to be read and for connecting the selected bit line to a read data line;
a comparator circuit for comparing the potential of said read data line with a reference potential; and
a read circuit that includes a fixed resistor where one end of the fixed resistor is connected to said read data line and a predetermined fixed voltage is applied to the other end of the fixed resistor.

13. The nonvolatile semiconductor memory device according to claim 12, wherein
the resistance value of said fixed resistor is set at a resistance value in a low resistance condition of said variable resistive element, said word line voltage application circuit applies the selected first word line voltage to the selected word line connected to the selected memory cell to be read and applies the selected second word line voltage to the unselected word lines other than said selected word line at the time of the reading operation,
said bit line voltage application circuit is in a high impedance condition where no voltage is applied to any of said bit lines in said memory array at the time of the reading operation, and
said first word line voltage is set so that the voltage difference between said first word line voltage and said second word line voltage is no more than said second voltage difference, and said second word line voltage is set at the value of said predetermined fixed voltage.

14. The nonvolatile semiconductor memory device according to claim 1, wherein
said memory array is formed of a plurality of sub-arrays from which one sub-array can arbitrarily be selected, and
said word line voltage application circuit is formed so as to selectively apply said word line voltage to a word line of the selected sub-array and said bit line voltage application circuit is formed so as to selectively apply said bit line voltage to a bit line of the selected sub-array, respectively.

15. The nonvolatile semiconductor memory device according to claim 14, wherein
a signal for selecting a sub-array from among said plurality of sub-arrays is generated from an address signal.

16. A programming method of a nonvolatile semiconductor memory device, wherein
said nonvolatile semiconductor memory device comprises a memory array formed of a plurality of memory cells, each having a variable resistive element of which the resistance value is changed in a reversible manner by applying a voltage, aligned in the directions of rows and columns, respectively, in a manner where one end of each memory cell in the same row is connected to the same word line and the other end of each memory cell in the same column is connected to the same bit line,
a first word line voltage, a second word line voltage, a first bit line voltage and a second bit line voltage are set at particular voltage values in accordance with programming operation so that the voltage difference between said first word line voltage and said first bit line voltage is no less than a first voltage difference that allows the resistance value of said variable resistive element to exceed a predetermined value as a result of a change in the case where the first voltage difference is applied across both ends of said variable resistive element and so that the voltage difference between said first word line voltage and said second bit line voltage, the voltage difference between said second word line voltage and said first bit line voltage and the voltage difference between said second word line voltage and said second bit line voltage are no more than a second voltage difference that does not allows the resistance value of said variable resistive element to exceed a predetermined value as a result of a change in the case where the second voltage difference is applied across the both ends of said variable resistive element, and
at the time of programming operation, said first word line voltage is selected and applied to the selected word line connected to a selected memory cell to be programmed; said second word line voltage is selected and applied to the unselected word lines other than said selected word line; said first bit line voltage is selected and applied to the selected bit line connected to said selected memory cell; and said second bit line voltage is selected and applied to the unselected bit lines other than said selected bit line.

17. The programming method according to claim 16, wherein
said second word line voltage is selected and applied to all of said word lines in said memory array before the start of the programming operation of said memory array, and said second bit line voltage is selected and applied to all of said bit lines in said memory array.

18. The programming method according to claim 16, wherein
said variable resistive element has resistance varying characteristics where the resistance value of said variable resistive element increases to exceed a predetermined value when a voltage which is equal to or more than a first threshold voltage is applied across both ends of said variable resistive element and the resistance value of said variable resistive element decreases to exceed a predetermined value when a voltage which is equal to or more than a second threshold voltage which has the polarities opposite to those of said first threshold voltage is applied across both ends of said variable resistive element, and said second voltage difference is set at a value lower than the threshold voltage which is the lower of either said first threshold voltage or said second threshold voltage.

19. The programming method according to claim 18, wherein said second threshold voltage is lower than said first threshold voltage.

20. The programming method according to claim 16, wherein said first word line voltage, said second word line voltage, said first bit line voltage and said second bit line voltage are set as follows: said first word line voltage is higher than said second bit line voltage; said second bit line voltage is no less than said second word line voltage; and said second word line voltage is higher than said first bit line voltage.

21. The programming method according to claim 20, wherein the voltage difference between said first word line voltage and said second bit line voltage, the voltage difference between said second word line voltage and said first bit line voltage and the voltage difference between said second word line voltage and said second bit line voltage are equal to one another.

22. The programming method according to claim 20, wherein the voltage difference between said first word line voltage and said second bit line voltage and the voltage difference between said second word line voltage and said first bit line voltage are greater than the voltage difference between said second word line voltage and said second bit line voltage.

23. The programming method according to claim 16, wherein said variable resistive element is made of an oxide having a perovskite structure that contains manganese.

24. The programming method according to claim 16, wherein said memory array is formed of a plurality of sub-arrays from which one sub-array can arbitrarily be selected, and said first word line voltage is selectively applied to the selected word line of the selected sub-array and said first bit line voltage is selectively applied to the selected bit line of said selected sub-array, respectively.

25. The programming method according to claim 24, wherein said second word line voltage is selectively applied to said unselected word lines of said selected sub-array in the case where said unselected word lines are included in said selected sub-array, and said second bit line voltage is selectively applied to said unselected bit lines of said selected sub-array in the case where said unselected bit lines are included in said selected sub-array.

26. The programming method according to claim 24, wherein a signal for selecting a sub-array from among said plurality of sub-arrays is generated from an address signal.

27. An erasing method of a nonvolatile semiconductor memory device, wherein said nonvolatile semiconductor memory device comprises a memory array formed of a plurality of memory cells, each having a variable resistive element of which the resistance value is changed in a reversible manner by applying a voltage, aligned in the directions of rows and columns, respectively, in a manner where one end of each memory cell in the same row is connected to the same word line and the other end of each memory cell in the same column is connected to the same bit line, a first word line voltage, a second word line voltage, a first bit line voltage and a second bit line voltage are set at particular voltage values in accordance with erasing operation so that the voltage difference between said first word line voltage and said first bit line voltage is no less than a first voltage difference that allows the resistance value of said variable resistive element to exceed a predetermined value as a result of a change in the case where the first voltage difference is applied across both ends of said variable resistive element and so that the voltage difference between said first word line voltage and said second bit line voltage, the voltage difference between said second word line voltage and said first bit line voltage and the voltage difference between said second word line voltage and said second bit line voltage are no more than a second voltage difference that does not allows the resistance value of said variable resistive element to exceed a predetermined value as a result of a change in the case where the second voltage difference is applied across the both ends of said variable resistive element, and at the time of erasing operation, said first word line voltage is selected and applied to the selected word line connected to a selected memory cell to be erased; said second word line voltage is selected and applied to the unselected word lines other than said selected word line; said first bit line voltage is selected and applied to the selected bit line connected to said selected memory cell; and said second bit line voltage is selected and applied to the unselected bit lines other than said selected bit line.

28. The erasing method according to claim 27, wherein said second word line voltage is selected and applied to all of said word lines in said memory array before the start of the erasing operation of said memory array, and said second bit line voltage is selected and applied to all of said bit lines in said memory array.

29. The erasing method according to claim 27, wherein said variable resistive element has resistance varying characteristics where the resistance value of said variable resistive element increases to exceed a predetermined value when a voltage which is equal to or more than a first threshold voltage is applied across both ends of said variable resistive element and the resistance value of said variable resistive element decreases to exceed a predetermined value when a voltage which is equal to or more than a second threshold voltage which has the polarities opposite to those of said first threshold voltage is applied across both ends of said variable resistive element, and said second voltage difference is set at a value lower than the threshold voltage which is the lower of either said first threshold voltage or said second threshold voltage.

30. The erasing method according to claim 29, wherein said second threshold voltage is lower than said first threshold voltage.

31. The erasing method according to claim 27, wherein said first word line voltage, said second word line voltage, said first bit line voltage and said second bit line voltage are set as follows: said first word line voltage is lower than said second bit line voltage; said second bit line voltage is no more than said second word line voltage; and said second word line voltage is lower than said first bit line voltage.

32. The erasing method according to claim 31, wherein the voltage difference between said first word line voltage and said second bit line voltage, the voltage difference between said second word line voltage and said first bit line voltage and the voltage difference between said second word line voltage and said second bit line voltage are equal to one another.

33. The erasing method according to claim 31, wherein the voltage difference between said first word line voltage and said second bit line voltage and the voltage difference between said second word line voltage and said first bit line voltage are greater than the voltage difference between said second word line voltage and said second bit line voltage.

34. The erasing method according to claim 27, wherein said variable resistive element is made of an oxide having a perovskite structure that contains manganese.

35. The erasing method according to claim 27, wherein said memory array is formed of a plurality of sub-arrays from which one sub-array can arbitrarily be selected, and said first word line voltage is selectively applied to the selected word line of the selected sub-array and said first bit line voltage is selectively applied to the selected bit line of said selected sub-array, respectively.

36. The erasing method according to claim 35, wherein said second word line voltage is selectively applied to said unselected word lines of said selected sub-array in the case where said unselected word lines are included in said selected sub-array, and said second bit line voltage is selectively applied to said unselected bit lines of said selected sub-array in the case where said unselected bit lines are included in said selected sub-array.

37. The erasing method according to claim 35, wherein a signal for selecting a sub-array from among said plurality of sub-arrays is generated from an address signal.

* * * * *